United States Patent
Xin et al.

(10) Patent No.: US 12,284,033 B2
(45) Date of Patent: Apr. 22, 2025

(54) DATA RETRANSMISSION IN WIRELESS NETWORK

(71) Applicant: Huawei Technologies Co., Ltd., Guangdong (CN)

(72) Inventors: Yan Xin, Kanata (CA); Wei Lin, Shenzhen (CN); Kwok Shum Au, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 549 days.

(21) Appl. No.: 17/372,091

(22) Filed: Jul. 9, 2021

(65) Prior Publication Data

US 2021/0336719 A1 Oct. 28, 2021

Related U.S. Application Data

(63) Continuation of application No. PCT/CN2019/071317, filed on Jan. 11, 2019.

(51) Int. Cl.
*H04L 1/00* (2006.01)
*H04L 1/1607* (2023.01)
(Continued)

(52) U.S. Cl.
CPC .......... *H04L 1/0057* (2013.01); *H04L 1/0071* (2013.01); *H04L 1/1614* (2013.01);
(Continued)

(58) Field of Classification Search
None
See application file for complete search history.

(56) References Cited

U.S. PATENT DOCUMENTS 9,876,614 B1 * 1/2018 Sun .................. H04L 1/1685
2004/0123229 A1 6/2004 Kim et al.
(Continued)

FOREIGN PATENT DOCUMENTS

CN 101069357 A 11/2007
CN 101150551 A 3/2008
(Continued)

OTHER PUBLICATIONS

Ericsson. Code Block Segmentation. 3GPP TSG RAN WG1 Meeting #89 R1-1707065. May 19, 2017, total 4 pages. Best Available Date: May 15-19, 2017.
(Continued)

*Primary Examiner* — San Htun

(57) ABSTRACT

Methods and devices are disclosed for transmitting data, including segmenting a group of information bits into a set of information blocks that each include a respective plurality of the information bits; encoding, using low density parity check (LDPC) encoding, each of the information blocks to generate corresponding codewords; transmitting the codewords to a destination station; receiving a feedback message indicating that at least one of the codewords has not been successfully decoded by the destination station; interleaving the information bits of the information block that corresponds to the at least one of the codewords; encoding, using low density parity check (LDPC) encoding, the interleaved information bits to generate an interleaved codeword; and transmitting the interleaved codeword to the destination station.

20 Claims, 16 Drawing Sheets

(51) Int. Cl.
*H04L 1/1812* (2023.01)
*H04W 84/12* (2009.01)
*H04W 40/12* (2009.01)

(52) U.S. Cl.
CPC ......... *H04L 1/1812* (2013.01); *H04W 40/125* (2013.01); *H04W 84/12* (2013.01)

(56) References Cited

U.S. PATENT DOCUMENTS

| | | | |
|---|---|---|---|
| 2008/0294959 A1 | 11/2008 | Chindapol et al. | |
| 2009/0031185 A1 | 1/2009 | Xhafa et al. | |
| 2009/0086699 A1 | 4/2009 | Niu et al. | |
| 2011/0264979 A1* | 10/2011 | Gunnam | H03M 13/2906 714/752 |
| 2015/0341054 A1* | 11/2015 | Myung | H03M 13/255 714/776 |
| 2016/0218824 A1 | 7/2016 | Kim et al. | |
| 2017/0230149 A1* | 8/2017 | Wang | H04L 1/1819 |
| 2017/0279464 A1 | 9/2017 | Noh et al. | |
| 2018/0234114 A1* | 8/2018 | Soriaga | H03M 13/6516 |
| 2018/0331788 A1* | 11/2018 | Kim | H04L 1/007 |
| 2018/0367245 A1 | 12/2018 | Soriaga et al. | |
| 2019/0052290 A1* | 2/2019 | Andersson | H03M 13/1168 |
| 2020/0052832 A1* | 2/2020 | Tian | H04L 1/1614 |

FOREIGN PATENT DOCUMENTS

| | | |
|---|---|---|
| CN | 102124772 A | 7/2011 |
| JP | 2001244822 A | 9/2001 |
| JP | 2006157898 A1 | 6/2006 |
| KR | 20180107692 A | 10/2018 |
| WO | 2017091244 A1 | 6/2017 |
| WO | 2017196827 A1 | 11/2017 |

OTHER PUBLICATIONS

International Search Report and Written Opinion of PCT/CN2019/071317 dated Sep. 29, 2019.
Jie Li et al: "Soft Information Combining for Turbo-MIMO Packet Retransmission", Wireless Personal Communications, Kluwer Academic Publishers, Do, vol. 45, No. 1, XP019582201. Oct. 12, 2007.
ZTE, Sanechips, On bit reversal in bit-level interleaver, 3GPP TSG RAN WG1 Meeting 90bis, Prague, Czechia, R1-1718408, 10 pages. Oct. 2017, Best Available Date: Oct. 9-13, 2017.
Sabah, N. M. et al. "The Use of Negative Acknowledgement Control Packets (NACKs) to Improve Throughput and Delay in IEEE 802.11 Networks", 2010 2nd International Conference on Computer Technology and Development (ICCTD 2010) 2010.
Gallagher, R. G. "Low-density parity-check codes," IRE Trans. Inf. Theory, vol. 8, No. 1, pp. 21-28, Best Available Date: Jan. 1962.
Di, C. et al. "Finite-length analysis of low-density parity-check codes on the binary erasure channel," IEEE Trans. Inf. Theory, vol. 48, No. 6, pp. 1570-1579, Best Available Date: Jun. 2022.
Richardson, T. "Error floors of LDPC codes," Proc. annual Allerton conference on commun. control and computing, vol. 41, No. 3, pp. 1426-1435, Best Available Date: 2003.
Hu, X.-Y. et al. "Progressive edge-growth Tanner graphs," IEEE Global Telecommun. Conf., vol. 2, pp. 995-1001, Best Available Date: Jan. 10, 2005.
Laendner, S. et al. "When does one redundant parity-check equation matter?" IEEE Globecom 2006, pp. 1-6.
Ivkovic, M. et al. "Eliminating trapping sets in low-density parity-check codes by using Tanner graph covers," IEEE Trans. Inf. Theory, vol. 54, No. 8, pp. 3763-3768, Best Available Date: 2008.
IEEE802.11-2016, Wireless LAN Medium Access Control (MAC) and Physical Layer (PHY) Specifications. Section 10.23.2.12 Retransmit procedures.
Lin, S. et al. "Error Control Coding" Pearson Prentice Hall (Chapter 15 Automatic Repeat Request Strategies), Best Available Date: 1983.

* cited by examiner

| Code rate | information block/source word length k (bits) | LDPC codeword length n (bits) | Number of rows (M) of the row-column interleaver 1202 |
|---|---|---|---|
| 1/2 | 972 | 1944 | 18 |
| 1/2 | 648 | 1296 | 12 |
| 1/2 | 324 | 648 | 6 |
| 2/3 | 1296 | 1944 | 24 |
| 2/3 | 864 | 1296 | 16 |
| 2/3 | 432 | 648 | 8 |
| 3/4 | 1458 | 1944 | 27 |
| 3/4 | 972 | 1296 | 18 |
| 3/4 | 486 | 648 | 9 |
| 5/6 | 1620 | 1944 | 30 |
| 5/6 | 1080 | 1296 | 20 |
| 5/6 | 540 | 648 | 10 |

FIG. 12

$|B_j = x_b \quad (b=0,1,2,...,k-1)$

Circular Permutation Interleaver 1300

$b = (a + P(R) \cdot N_{ROT}) \bmod k$ $s'_j = y_a \quad (a=0,1,2,...,k-1)$

FIG. 13

DATA RETRANSMISSION IN WIRELESS NETWORK

RELATED APPLICATIONS

The present application is a continuation of, and claims benefit of and priority to, International Application No. PCT/CN2019/071317 filed Jan. 11, 2019, entitled "DATA RETRANSMISSION IN WIRELESS NETWORK", the contents of which are incorporated herein by reference.

TECHNICAL FIELD

The present application relates to mobile air interface technologies, in particular to methods and systems for retransmitting data.

BACKGROUND

Automatic repeat request (ARQ) is an error-control method for data transmission that can be applied to improve reliability in a communication system such as a wireless communication system. ARQ protocols typically use acknowledgements and timeouts that allow a transmitter to detect if an error has occurred in respect of a previously transmitted data frame, and retransmit some or all of the data frame if an error is detected. For example, if a transmitter does not receive an expected acknowledgement (Ack) within a specified timeout period in respect of a transmitted data frame, the transmitter will determine an error has occurred and retransmit some or all of the previously transmitted data frame. Some ARQ protocols may also rely on negative acknowledgment (Nack) messages sent by a receiver that specify that an error has occurred.

ARQ protocols are specified as medium access control (MAC) procedures in networks that operate according to Wi-Fi protocols such as IEEE 802.11a/n/ac/ad [IEEE std 802.11™-2016], IEEE 802.11ax [802.11axD3.2], IEEE 802.11ay [802.11ayD2.0]. For example, IEEE std 802.11™-2016 specifies an ARQ protocol for the transmission of a physical layer (PHY) protocol data unit (PPDU) that embeds a single MAC protocol data unit (MPDU), and also for the transmission of an aggregate-MPDU (A-MPDU) PPDU that embeds multiple MPDUs. In the case of a single-MPDU PPDU transmitted with an Ack requirement, a receiving station that successfully receives the MPDU (with success being determined based on a frame check sequence (FCS)) will transmit an Ack frame following a defined short interframe space (SIFS). The transmitting station will interpret a failure to receive a valid Ack frame within a specified timeout period as failure of the MPDU transmission. The transmitting station may then retransmit the MPDU. In the case of an A-MPDU PPDU, the receiving station determines the success of each MPDU individually based on respective FCSs and then transmits a BlockAck frame that includes a Block Ack bitmap that specifies a decoding error status (e.g. successful or unsuccessful) for each of the MPDUs. Upon receiving a BlockAck frame in response to a transmitted A-MPDU PPDU, the transmitting station may requeue and retransmit data from any MPDUs that were indicated in the Block Ack bitmap as unsuccessful.

Forward error correction (FEC) is a further error-control method for data transmission that can be applied to improve reliability in a communication system such as a wireless communication system. Although ARQ methods suffer from decreasing throughput as channel error rate increases, the throughput of FEC methods for a given code rate is not substantially changed as channel error rate increases. The combination of ARQ and FEC, known as hybrid ARQ (HARQ), has been adopted or considered in wireless network systems, including for example 3rd Generation Partnership Project (3GPP) $4^{th}$ Generation (4G) Long Term Evolution LTE) [3GPP TS 36.212 v12.0.0] and 5th Generation (5G) New Radio (NR) [3GPP TS 38.212 v15.2.0]. Further development of HARQ error-control methods, including methods for use in wireless local area network (WLAN) systems such as Wi-Fi, is desirable.

SUMMARY

According to a first example aspect is a method of transmitting data. The method includes: segmenting a group of information bits into a set of information blocks that each include a respective plurality of the information bits; encoding, using low density parity check (LDPC) encoding, each of the information blocks to generate corresponding codewords; transmitting the codewords to a destination station; receiving a feedback message indicating that at least one of the codewords has not been successfully decoded by the destination station; interleaving the information bits of the information block that corresponds to the at least one of the codewords; encoding, using low density parity check (LDPC) encoding, the interleaved information bits to generate an interleaved codeword; and transmitting the interleaved codeword to the destination station.

In some example embodiments of the first example aspect, the method includes selecting an interleaver to use for the interleaving based on an LDPC code used for the LDPC encoding. In some example, the method includes selecting an interleaver to use for the interleaving based on a number of times the information bits of the information block that corresponds to the at least one codeword have been previously included in codewords sent to the destination station. In some examples, interleaving the information bits comprises applying row-column block interleaving to the information bits by writing the information bits into an M row by N column matrix in a first order and reading the information bits out of the matrix in a second order, wherein M*N is equal to the number of information bits. In some examples, N=54, and the information bits are written into the matrix on a row-by-row basis and read out of the matrix on a column-by-column basis. In some examples, interleaving the information bits comprises applying circular permutation interleaving.

In some example embodiments of the first example aspect, the feedback message includes a codeword bitmap field containing a decoding status bit for each codeword indicating whether the codeword was successfully decoded.

According to a second example aspect is a station configured to perform the method of the first example aspect. In an example embodiment, the station is for use in a wireless area local area network (WLAN), and configured to: segment a group of information bits into a set of information blocks that each include a respective plurality of the information bits; encode, using low density parity check (LDPC) encoding, each of the information blocks to generate corresponding codewords; transmit the codewords to a destination station; receive a feedback message indicating that at least one of the codewords has not been successfully decoded by the destination station; interleave the information bits of the information block that corresponds to the at least one of the codewords; encode, using low density parity check (LDPC) encoding, the interleaved information bits to generate an interleaved codeword; and transmit the interleaved codeword to the destination station.

According to a third example aspect is a method for decoding codewords at a station of a wireless local area network (WLAN). The method includes: receiving at the station, through a wireless medium, a first packet that includes a plurality of low density parity check (LDPC) encoded codewords; and transmitting a feedback message that includes a codeword bitmap field containing a decoding status bit for each codeword indicating whether the codeword was successfully decoded.

In some example embodiments of the third example aspect, the feedback message includes a frame that includes, in the following order: a frame control field, a duration field, the codeword bitmap field, and a frame check sequence (FCS) field. In some examples, the frame control field and the duration field each have a size of 2 octets, the codeword bitmap field has a size of 6 octets, and the FCS field has a size of 4 octets.

In some example embodiments of the third example aspect, the feedback message comprises a frame that includes, in the following order: a frame control field, a duration field, a receiver address field, the codeword bitmap field and a frame check sequence (FCS) field. In some examples the frame control field and the duration field each have a size of 2 octets, the receiver address field has a size of 6 octets, the codeword bitmap field has a size of 6 octets, and the FCS field has a size of 4 octets. In some examples, the codeword bitmap field has a size greater than 6 octets.

In some example embodiments of the third example aspect, the first packet includes multiple data units that each include a respective plurality of LDPC encoded codewords, the codeword bitmap including a decoding status bit for each of the codewords included in the data units. In some examples, the feedback message comprises a block acknowledgement (BA) frame that includes, in the following order: a frame control field, a duration field, a receiver address field, a transmitter address field, a BA control field, BA bitmap field that indicates a respective status bit for each of the data units, a codeword bitmap field for the codeword bitmap, and a frame check sequence (FCS) field.

In some example embodiments of the third example aspect, the method includes, after transmitting the message, receiving at the station, through the wireless medium, a second packet including an LDPC encoded codeword generated at a source station by interleaving the information bits used to generate a corresponding codeword included in the first packet and indicated in the message as having an unsuccessful decoding status; and decoding the LDPC codeword included in the second packet.

In some examples, decoding the LDPC codeword included in the second packet includes combing information from LDPC codeword included in the second packet with information from the corresponding codeword included in the first packet.

In some example embodiments of the third example aspect, combining information includes soft combining loglikelihood ratio (LLR) values obtained in respect of information bits included in the LDPC codeword included in the second packet with LLR values obtained in respect of corresponding information bits included the corresponding codeword included in the first packet. In some examples, combining information includes concatenating the soft combined LLR values for the information bits with values obtained in respect of parity check bits included in the LDPC codeword included in the second packet. In some examples, combining information includes concatenating the soft combined LLR values for the information bits with values obtained in respect of parity check bits included in the LDPC codeword included in the first packet.

In some example embodiments of the third example aspect, combining information includes: soft combining channel bit values obtained in respect of information bits included in the LDPC codeword included in the second packet with channel bit values obtained in respect of corresponding information bits included the corresponding codeword included in the first packet. In some examples, combining information includes concatenating the soft combined channel bit values for the information bits with values obtained in respect of parity check bits included in the LDPC codeword included in the second packet. In some examples, combining information includes concatenating the soft combined channel bit values for the information bits with values obtained in respect of parity check bits included in the LDPC codeword included in the first packet.

According to a fourth example aspect is a station enabled for use in a wireless area local area network (WLAN) and configured to perform the method of the third example aspect.

In at least some configurations, some of the example aspects may mitigate against patterns in the codeword bits that could fall into trapping sets or improve the reliability of retransmission data provided to a decoder, or both, improving one or both of efficiency and accuracy in a communication system.

BRIEF DESCRIPTION OF THE DRAWINGS

Reference will now be made, by way of example, to the accompanying figures which show example embodiments of the present application, and in which:

FIG. 12 is a chart illustrating possible matrix dimensions for row-column block interleavers for different LPDC codes, according to example embodiments.

FIG. 13 illustrates an example of a circular permutation interleaver.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems for retransmitting data in a wireless network. Next generation WLAN systems, including for example next generation Wi-Fi systems, will require higher data rates and higher reliability than prior generation systems. HARQ error control methods may help achieve high data rate and reliability goals. As noted above, HARQ error control includes a combination of ARQ and FEC error control methods. In at least some Wi-Fi systems (for examples IEEE 802.11/n/ac/ax compliant systems), low-density parity-check (LDPC) codes are employed for FEC. Example embodiments of a HARQ error control method are presented in this disclosure that combine LPDC code based FEC error control procedures with Nack error control procedures in a WLAN system.

Figure 1:
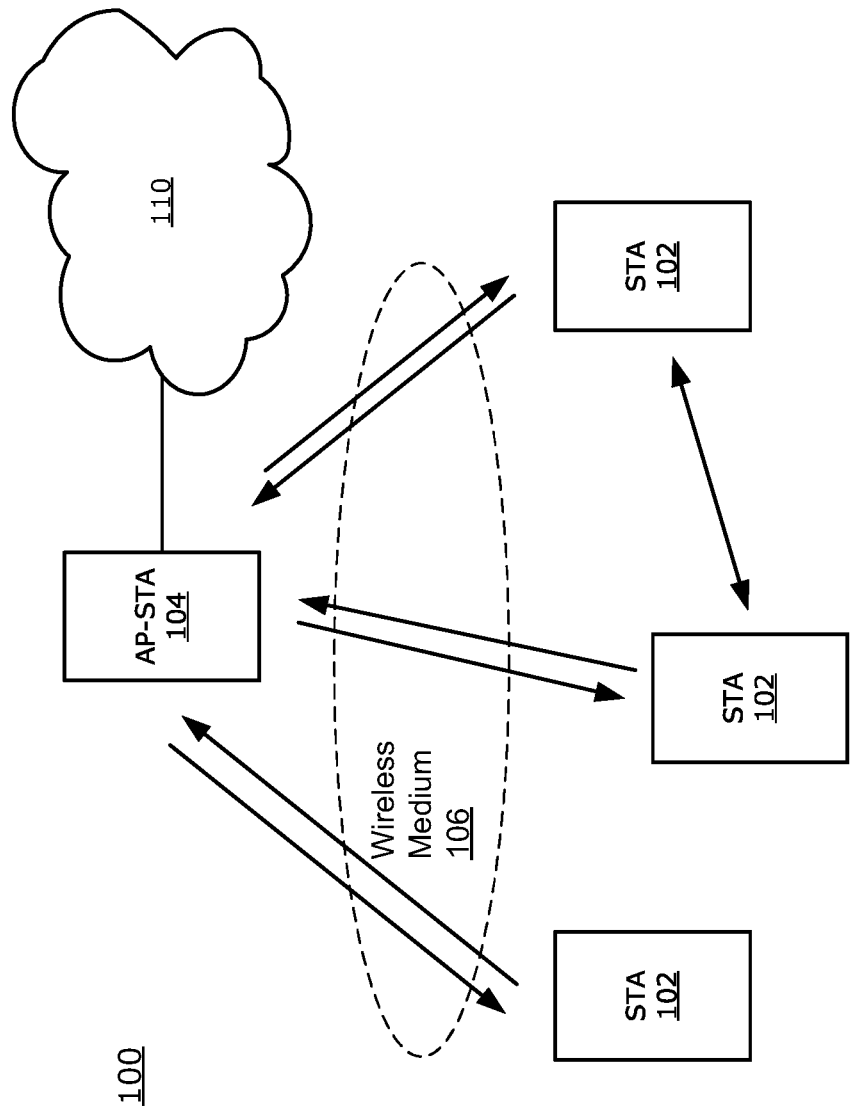
FIG. 1 is a block diagram illustrating an example communication network in accordance with one implementation of the present disclosure.

An example of an environment in which the error control procedures described below can operate will be provided with reference to FIGS. 1 and 2. FIG. 1 illustrates a communication network 100 comprising a plurality of stations (STAs) that can include fixed, portable, and moving stations. The example of FIG. 1 illustrates a single fixed STA, access-point station (AP-STA) 104, and a plurality of STAs 102 that may be portable or mobile. Each of the STAs 102 and AP-STA 104 may include a transmitter, a receiver, an encoder, a decoder, a modulator, and/or demodulator as described herein. The network 100 may operate according to one or more communications or data standards or technologies, however in at least some examples the network 100 is a WLAN, and in at least some examples is a next generation Wi-Fi compliant network that operates in accordance with one or more protocols from the 802.11 family of protocols.

Each STA 102 may be a laptop, a desktop PC, PDA, Wi-Fi phone, wireless transmit/receive unit (WTRU), mobile station (MS), mobile terminal, smartphone, mobile telephone, sensor, internet of things (IOT) device, or other wireless enabled computing or mobile device. In some embodiments, a STA 102 comprises a machine which has the capability to send, receive, or send and receive data in the communications network 100 but which performs primary functions other than communications. In some embodiments, a machine includes an apparatus or device with means to transmit and/or receive data through the communications network 100 but such apparatus or device is not typically operated by a user for the primary purpose of communications. The AP-STA 104 may comprise a network access interface which functions as a wireless transmission and/or reception point for STAs 102 in the network 100. The AP-STA 104 may be connected to a backhaul network 110 which enables data to be exchanged between the AP-STA 104 and other remote networks (including for example the Internet), nodes, APs, and devices (not shown). The AP-STA 104 may support communications through unlicensed radio frequency spectrum wireless medium 106 with each STA 102 by establishing uplink and downlink communications channels with each STA 102, as represented by the arrows in FIG. 1. In some examples, STAs 102 may be configured to communicate with each other. Communications in the network 100 may be unscheduled, scheduled by the AP-STA 104 or by a scheduling or management entity (not shown) in the network 100, or a mix of scheduled and unscheduled communications.

Figure 2:
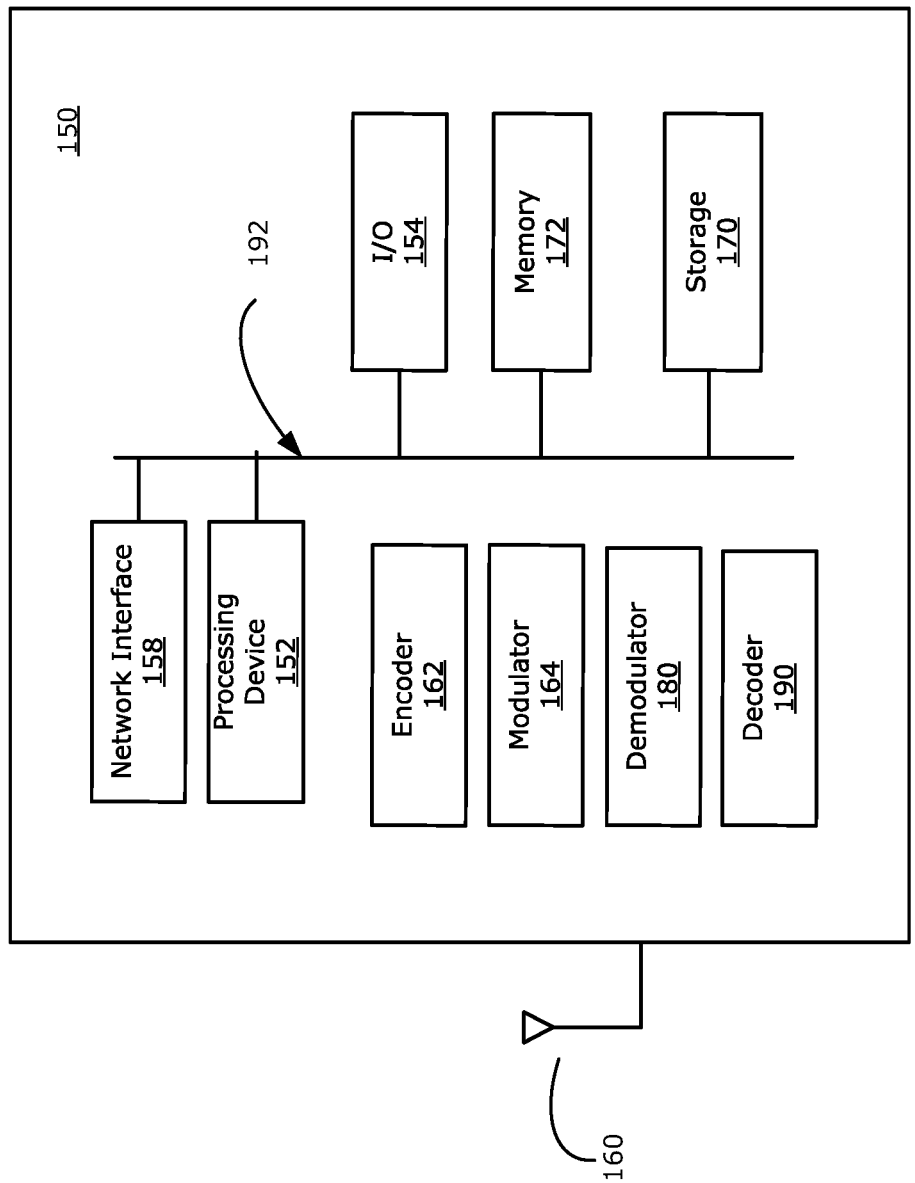
FIG. 2 is a block diagram illustrating an example processing system in accordance with one implementation of the present disclosure.

FIG. 2 illustrates an example processing system 150, which may be used to implement methods and systems described herein, such as the STA 102 or the AP-STA 104. Other processing systems suitable for implementing the methods and systems described in the present disclosure may be used, which may include components different from those discussed below. Although FIG. 2 shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network. In example embodiments, network interfaces 158 include one or more wireless transceivers that enable communications in a WLAN such as network 100. Network interfaces 158 may also include interfaces for wired or wireless communication with networks, such as but not limited to, an intranet, the Internet, a P2P network, a WAN, LAN, and/or a cellular or mobile communications network such as a 5G NR, 4G LTE or other network as noted above. The network interface(s) 158 may include interfaces for wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this regard, some network interface(s) 158 may include respective processing systems that are similar to processing system 150. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other STAs, user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

In example embodiments the processing system 150 includes one or more encoders 162 for encoding source words to codewords and a modulator 164 for modulating codewords to symbols. As explained below, the encoder 162 performs LDPC encoding on source words to generate codewords in bits. The modulator 164 performs modulation on the codewords (e.g., by modulation techniques such as BPSK, QPSK, 16QAM, or 64QAM). In some examples, instructions coded in the memory 172 may configure processing device 152 to perform the functions of the encoder 162 and/or the modulator 164, such that the encoder 162 and/or the modulator 164 may not be distinct physical modules of the processing system 150. In some examples, the encoder 162 and the modulator 164 may be embodied within a transmitter module that is part of a network interface 158 of the processing system 150. In some examples, the transmitting antenna 160, the encoder 162, and the modulator 164 may be embodied as a transmitter component external to the processing system 150, and may simply communicate the source words from the processing system 150.

The processing system 150 may include a demodulator 180 and one or more decoders 190 for processing a received signal. The demodulator 180 may perform demodulation on a received modulated signal (e.g., a BPSK, QPSK, 16QAM, or 64QAM signal). The decoder 190 may then perform appropriate decoding on the demodulated signal, in order to recover the original source words contained in the received signal. In some examples, instructions coded in the memory 172 may configure processing device 152 to perform the functions of the demodulator 180 and/or the decoder 190, such that the demodulator 180 and/or the decoder 190 may not be distinct physical modules of the processing system 150. In some examples, the demodulator 180 and the decoder 190 may be embodied within a receiver module of a network interface 158 of the processing system 150. In some examples, the receiving antenna 160, demodulator 180 and decoder 190 may be embodied as a receiver component external to the processing system 150, and may simply communicate the signal decoded from the received signal to the processing system 150.

There may be a bus 192 providing communication among components of the processing system 150, including the processing device(s) 152, I/O interface(s) 154, network interface(s) 158, storage unit(s) 170, memory(ies) 172, encoder 162, modulator 164, demodulator 180 and decoder 190. The bus 192 may be any suitable bus architecture including, for example, a memory bus, a peripheral bus or a video bus.

Figure 3:
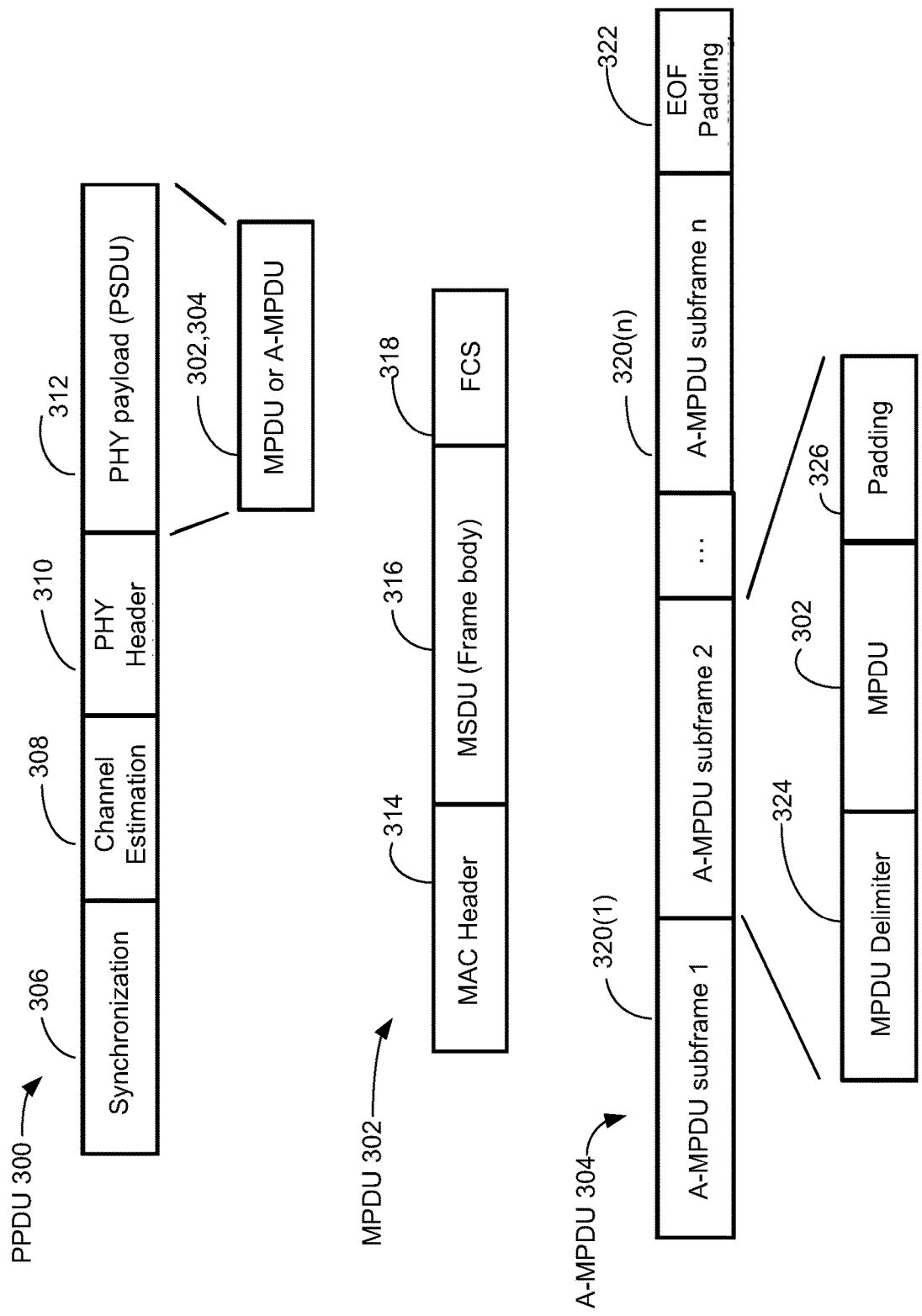
FIG. 3 illustrates example frame formats for exchanging information through a wireless medium of the communication network of FIG. 1.

In example embodiments, communications between STAs, including for example between a STA 102 and the AP-STA 104, in the network 100 may be implemented by encoding source words using low density parity check (LDPC) encoding techniques to generate codewords. The codewords resulting from LDPC encoding of respective source words are embedded in packets that are modulated and transmitted over a wireless medium between AP-STA 104 and STA 102. In example embodiments, the physical layer packet structure used for communications in network 100 corresponds to the PPDU packet structure defined in IEEE std 802.11™-2016, an example of which is shown in FIG. 3. In this regard, the PPDU 300 packet structure can include several fields that respectively include PHY preamble (synchronization information 306 and channel estimation information 308), PHY header information 310, and a PHY payload 312. The PHY payload 312 can be embedded with an encoded MPDU 302 or an A-MPDU 304.

As illustrated in FIG. 3, an MPDU 302 includes respective fields for MAC header information 314, a MAC service data unit (MSDU) 316 and an FCS 318. The FCS 318 includes a frame check sequence determined for the combined content of the MAC header information 314 and MSDU 316. An A-MPDU 304 includes multiple MPDUs 302. In particular, an A-MPDU includes A-MPDU sub-frames 320(1) to 320(n), followed by end of frame padding (EOF) 322. Each A-MPDU subframe 320(i) includes respective fields for an MPDU delimiter 324, MPDU 302, and padding 326.

Figure 4:
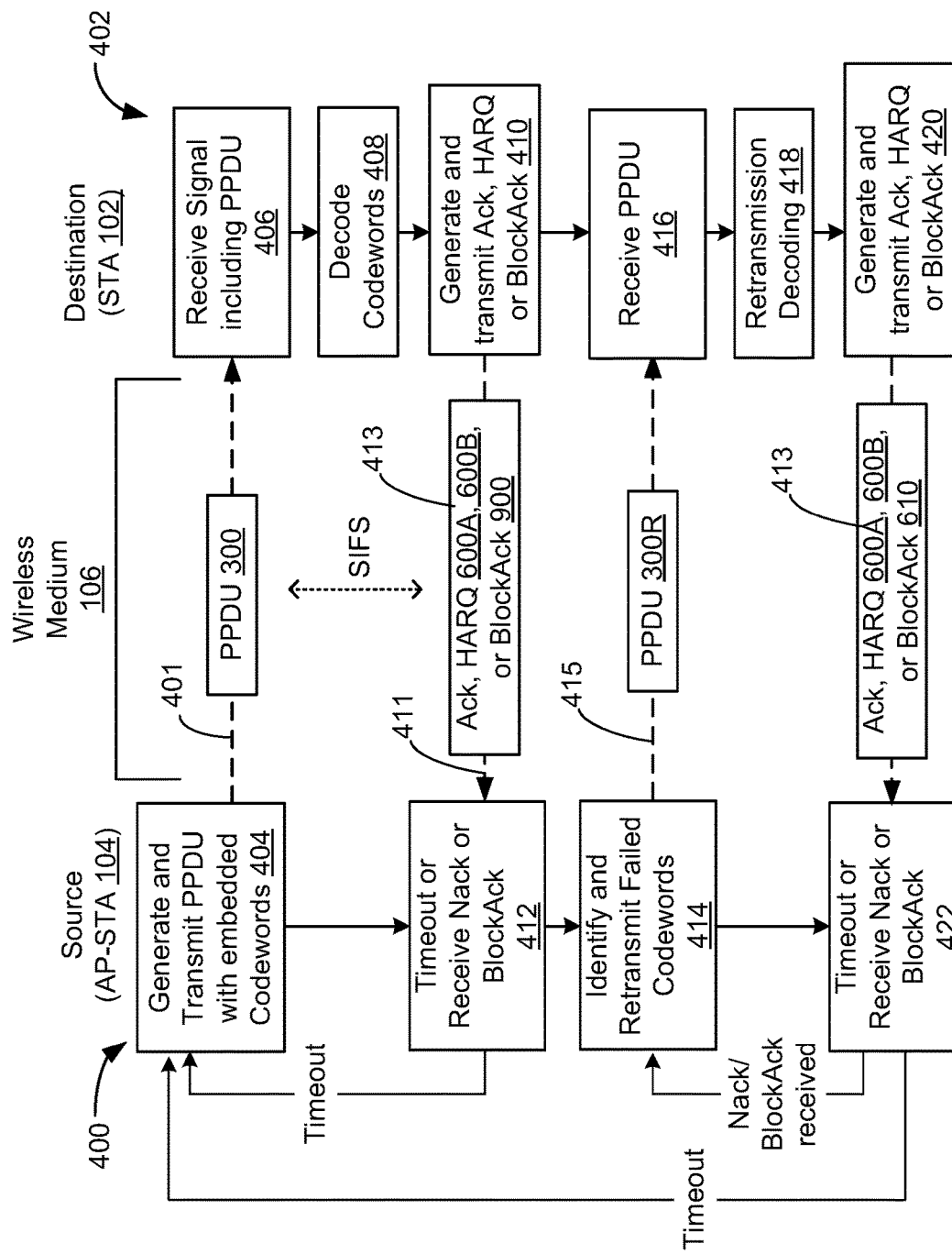
FIG. 4 is a block diagram representing actions taken at a source station, actions taken at a destination station, and signals exchanged between the source and destination stations, in the communication network of FIG. 1, according to example embodiments.

FIG. 4 illustrates, according to example embodiments, source actions 400 performed by a source station (for example AP-STA 104) and destination actions 402 performed by a destination station (for example a STA 102), in respect of codewords (included for example in a PPDU 300) transmitted through wireless medium 106. Although AP-STA 104 is illustrated as the source station and STA 102 is illustrated as the destination station in the present example, the roles can be reversed and furthermore, in some embodiments the destination station and source station may be two respective STAs 102 communicating with each other.

Figure 5:
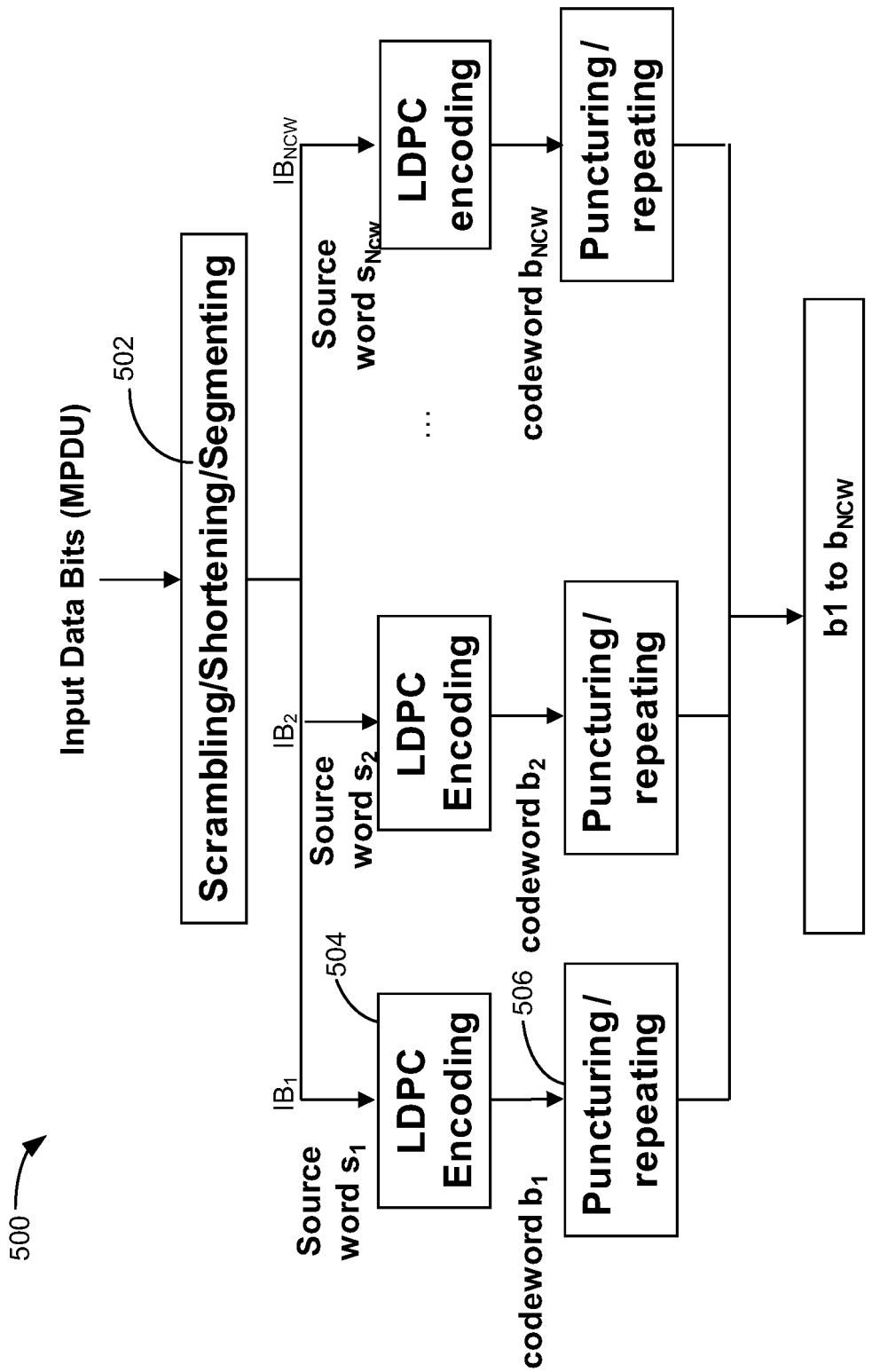
FIG. 5 is a block diagram of an encoding procedure at a source station, according to example embodiments.

As illustrated in FIG. 4, AP-STA 104 is configured to generate and transmit a PPDU 300 including one or more sets of LDPC codewords $b_1$ to $b_{NCW}$ (Action 404) which are obtained by LDPC-encoding one or more MPDUs 302. In this regard, FIG. 5 illustrates an example of an encoding procedure 500, which may for example be performed at an encoder 162 of the AP-STA 104, for generating a set of codewords $b_1$ to $b_{NCW}$ for inclusion in a PPDU 300. In example embodiments, encoding procedure 500 can be the same as known procedures used to generate LDPC codewords for a PPDU 300 that is compliant with IEEE std 802.11™-2016. In this regard, data bits (e.g. the bits that make up MPDU 302, or an A-MPDU 304) are subjected to scrambling, shortening and segmenting 502, resulting in a set of information blocks $IB_1$ to $IB_{NCW}$ that are each k-bits in length. In the example of FIG. 5, the information blocks $IB_1$ to $IB_{NCW}$ are used as respective k-bit source words $s_1$ to $s_{NCW}$ that are each subjected to LDPC encoding 504, resulting in respective n-bit codewords $b_1$ to $b_{NCW}$. In the present description, the subscript "j" is used to denote a generic information block $IB_j$, source word $s_j$, and codeword $b_j$ where $1 \leq j \leq NCW$.

In example embodiments, the LDPC encoding 504 applied in example embodiments uses LDPC codes that are specified in one or more of the IEEE 802.11n/ac/ax protocols, including for example the code rates and codeword block sizes specified in Sec. 19.3.11.7.2 of IEEE std 802.11™-2016 and the parity check matrices specified in Sec. 19.3.11.7.4 of IEEE std 802.11™-2016.

Accordingly, in encoding procedure 500, the data bits that are to be included in the PSDU 312 of PPDU 300 are segmented into Ncw information blocks $IB_1$ to $IB_{NCW}$, which correspond to NCW k-bit source words $s_1$ to $s_{NCW}$. Each k-bit source word $s_j$ may be considered as a 1×k row vector or a one-dimensional binary 1×k matrix $s_j=[s_1, \ldots, s_k]$. Each k-bit source word $s_j$ is then encoded to respective n-bit codeword $b_j=[b_1, \ldots, b_n]$ by multiplying the source word with a generator matrix G (e.g. b=s·G). The n-bit codeword $b_j$ includes k information bits and n-k parity check bits. In example embodiments, known procedures for generating LDPC codewords from source words using generator matrix G can be applied to perform LDPC encoding 504.

Codewords $b_1$ to $b_{NCW}$ may each be subjected to respective puncturing and repeating operations 506, and combined into a bitstream for inclusion in a PPDU 300. The codewords $b_1$ to $b_{NCW}$ in a PPDU 300 are modulated onto an RF signal 401 and transmitted to destination STA 403. As noted above, in some examples, PPDU 300 payload 312 may include a set of codewords generated from a single MPDU 302, and in some examples PPDU 300 payload 312 may include multiple codewords generated from multiple MPDUs 302 aggregated into an A-MPDU 304. The encoding procedure 500 is performed in the same manner as described above to generate a set of codewords for the bits in A-MPDU 304.

Figure 6:
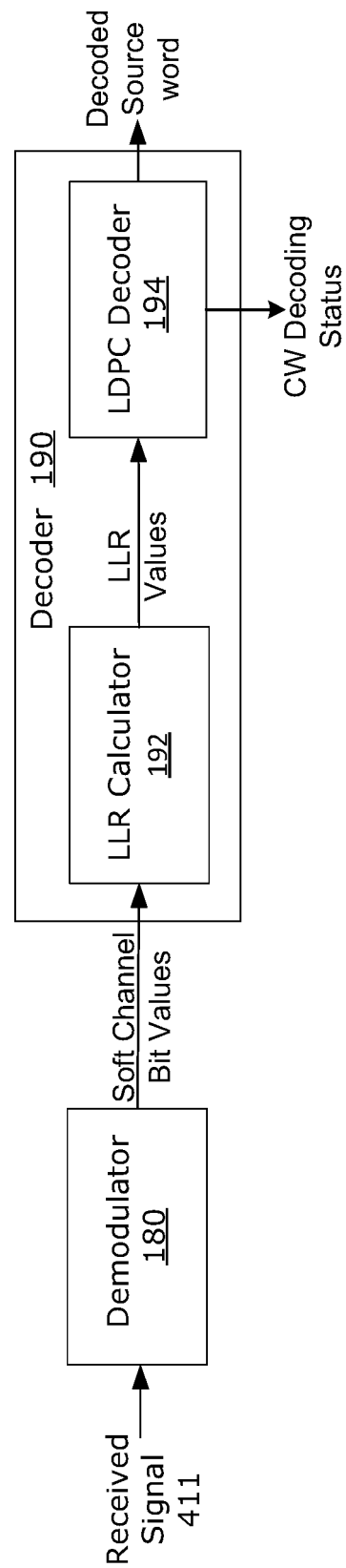
FIG. 6 is a block diagram representing a demodulator and decoder of a destination station, according to example embodiments.

Referring again to FIG. 4, destination STA 102 is configured to receive a signal modulated with the PPDU 300 (Action 406) transmitted by source AP-STA 104 and decode the received codewords $b_1^T$ to $b_{NCW}^T$ embedded in the PPDU 300 (Action 408) (superscript "T" denotes a codeword received at the destination STA 102 after passing through a channel of wireless medium 106). By way of example, FIG. 6 is a block diagram representation of demodulator 180 and decoder 190 of destination STA 102. In example embodiments, the received signal 411 is equalized to reduce intersymbol interference caused by the RF channel, and demodulated by demodulator 180 to generate an initial set of soft channel bit values for each of the codewords $b_1^T$ to $b_{NCW}^T$. In example embodiments, decoder 190 applies known procedures for decoding LDPC codewords $b_1^T$ to $b_{NCW}^T$. As known in the art, decoding is performed based on the parity check matrix H and Tanner graph corresponding to the generator matrix G applied at the transmitting source to generate LPDC codewords $b_1$ to $b_{NCW}$. In this regard, Decoder 190 includes a log-likelihood ratio (LLR) calculator 192 that is configured to calculate LLR values for each of the soft channel bits of a codeword $b_j^T$, which are initially assigned to the corresponding variable nodes of the Tanner graph during the decoding. An LDPC decoder 194 then applies an iterative message passing algorithm (MPA) based on the log-likelihood ratio (LLR) values to either successfully decode the codeword $b_j^T$ and recover the source word $s_j$, or determine that the codeword $b_j^T$ cannot be successfully decoded. As known in the art, a received codeword $b_j^T$ is determined to be valid (e.g. successfully decoded) if the codeword $b_j^T$, after decoding, can satisfy $H \cdot b_j^T = 0$. In example embodiments, decoder 190 provides a decoding status for each of the codewords $b_1^T$ to $b_{NCW}^T$ in the received PPDU 300, based on the validity of each codeword after decoding. In particular, the decoding status for each codeword $b_1^T$ to $b_{NCW}^T$ can be either: (a) successfully decoded or (b) unsuccessfully decoded.

As noted above, each set of codewords $b_1^T$ to $b_{NCW}^T$ corresponds to a MPDU 302, and thus the recovered source words obtained from decoding the codewords $b_1^T$ to $b_{NCW}^T$ correspond to the bits of an MPDU 302, which as indicated above includes a MAC header 314, an MSDU 316, and an FCS 318. In example embodiments, the decoder 190 is configured to determine a decoding status for the MPDU 302 based on whether an FCS calculated at the destination STA 102 in respect of the bits of the recovered MAC header 314 and MSDU 316 bits matches the recovered FCS 318. Accordingly, in example embodiments, decoder 190 provides a decoding status for MPDU 302 recovered from the received PPDU 300, along with the a decoding status for each of the codewords $b_1^T$ to $b_{NCW}^T$ that correspond to each MPDU 302.

In example embodiments, the destination STA 102 is configured to store the interim and final decoding results for any codewords $b_1^T$ to $b_{NCW}^T$ that are unsuccessfully decoded and thus labelled as unsuccessfully decoded. By way of example, destination STA 102 may provide a codeword decoding log that identifies, for each unsuccessfully decoded codeword $b_j^T$, one or both of: the soft channel bit values output by demodulator 180; and the LLR values output by LLR calculator 192. The soft bit LDPC decoding values generated during the iterations of the MPA performed by LDPC decoder 194 may also be stored. As described in greater detail below, in example embodiments, these values can be combined with corresponding values generated in respect of retransmitted codewords to assist in decoding of the retransmitted codewords.

Referring again to FIG. 4, in example embodiments, as indicated in Action 410, the destination STA 102 is configured to generate and send a feedback message 413 modulated on an RF signal 411 back to the source AP-STA 104 after a SIFS duration following the transmission of PPDU 300. In example embodiments, the type of feedback message 413 sent and the content of the feedback message 413 are based on a determination of whether (i) the decoding results are completely successful, or (ii) the decoding results include some errors. Accordingly, in some example embodiments, if the FCS decoding status for all MPDUs 302 indicates successful decoding, the destination STA 102 is configured to send a feedback message 413 using an Ack frame format that will be interpreted by the source AP-STA 104 as indicating complete decoding success. In some examples, the Ack frame format indicating successful decoding is identical to the Ack frame format specified in Sec 9.3.1.4 of IEEE std 802.11™-2016, and includes the following fields in the following order: 2 octet frame control field; 2 octet duration field; 6 octet receiver address (RA) field; and 4 octet FCS field.

In some examples, in the case where the FCS decoding status in respect of at least one MPDU indicates that an error has occurred, the feedback message 413 uses a HARQ frame format to provide a negative acknowledgement (Nack) message to the source AP-STA 104. In example embodiments, different types of HARQ frame formats are used for Nack-type feedback messages 413 in respect of PPDUs 300 that include a single MPDU 302 and PPDUs 300 that includes an A-MPDU 304. Examples of HARQ frame formats used to acknowledge a PPDU 300 that embeds a single MPDU 302 will be described first with respect to FIGS. 7 and 8.

Figure 7:
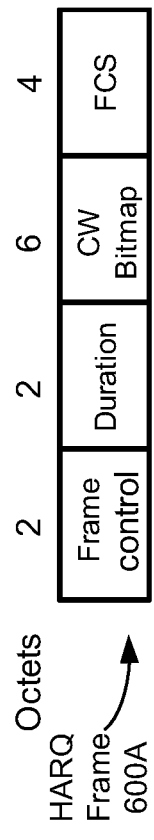
FIG. 7 illustrates a first example of a Nack frame format for use in the communication network of FIG. 1.

FIG. 7 shows the frame format of a HARQ frame 600A that can be modulated on an RF signal 411 in a first example embodiment as feedback message 413 to provide feedback from the destination STA 102 to the source AP-STA 104. HARQ frame 600A has a frame format that is identical to the format specified for a clear-to-send (CTS) frame in Sec. 9.3.1.3 of IEEE std 802.11™-2016, with the exception that the receiver address (RA) field of the MAC header of the CTS frame is replaced with a codeword (CW) Bitmap field. Accordingly, as shown in FIG. 7, the frame format for HARQ frame 600A has a length of 14 octets divided into the following fields: 2 octet "Frame control" field for frame control information; 2 octet "Duration" field; 6 octet "CW Bitmap" field and a 4 octet FCS field. The CW Bitmap is used to specify the decoding status for each received codeword $b_1^T$ to $b_{NCW}^T$. For example, each received codeword $b_1^T$ to $b_{NCW}^T$ can have a respective bit location allocated to it in the CW Bitmap, with a bit value of "1" in the location allocated to a codeword $b_j^T$ indicating that the codeword has been successfully decoded and a bit value of "0" in the location allocated to a codeword $b_j^T$ indicating that the codeword $b_j^T$ has been unsuccessfully decoded. It will be appreciated that a 6 octet "CW Bitmap" field includes 48 bits, thus allowing the decoding status for up to 48 codewords to be indicated. Accordingly, in the illustrated example, NCW≤48. In example embodiments, multiple HARQ frames may be used if the number of codewords is greater than 48. In an example embodiment, the Duration field is used for an estimated duration value for the total time required for: (i) transmission of pending data including any codewords to be retransmitted, which are identified in the CW Bitmap as being unsuccessfully decoded, and any new data to be transmitted from the source AP-STA 104 to the destination STA 102; (ii) a further HARQ or Ack frame to be transmitted; and (iii) two SIFS.

The HARQ frame 600A has the same length, 14 octets, as the current Ack frame format specified in Sec. 9.3.1.4 IEEE std 802.11™-2016. The use of a HARQ frame that is the same size as an Ack frame may in some examples facilitate an accurate estimation of the Duration time that is included in the Duration field.

Figure 8:
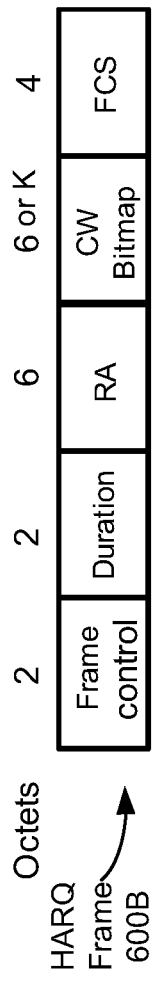
FIG. 8 illustrates a second example of a Nack frame format for use in the communication network of FIG. 1.

FIG. 8 shows the frame format of a HARQ frame 600B that can be modulated on RF signal 411 in a second example embodiment of feedback message 413 to provide feedback from the destination STA 102 to the source AP-STA 104. HARQ frame 600B has a frame format that longer than the 14 octet length of the current Ack frame format specified in Sec. 9.3.1.4 of IEEE std 802.11™-2016. In one example embodiment, HARQ frame 600B is identical to the format specified for a request-to-send (RTS) frame in Sec. 9.3.1.2 of IEEE std 802.11™-2016, with the exception that the sender or transmitter address (TA) field of the MAC header of the RTS frame is replaced with codeword (CW) Bitmap field. Accordingly, as shown in FIG. 8, in an example embodiment the frame format for HARQ frame 600B has a length of 20 octets divided into the following fields: 2 octet "Frame control" field; 2 octet "Duration" field; 6 octet "receiver address (RA)" field; 6 octet "CW Bitmap" field and a 4 octet FCS field.

In an example embodiment, the respective fields are used as follows: (A) Frame control field: the Frame control field includes Type and Subtype subfields that indicate that HARQ frame 600B is type of control frame that is not currently specified in IEEE std 802.11™-2016, namely a Control frame—"HARQ" (e.g., combination of Type value B3 B2=01 and Subtype value B7 B6 B5 B4=0011 in Frame control field indicates a "HARQ" type frame). (B) Duration field: the duration field includes a duration value is the total estimated time required for: (i) transmission of a pending data including any codewords to be retransmitted, which are identified in the CW Bitmap as being unsuccessfully decoded and new data to be transmitted from the source AP-STA 104 to the destination STA 102; (ii) a further HARQ frame or Ack frame to be transmitted; and (iii) two SIFS. (C) RA field: the RA field is the same as that defined for the Ack frame format specified in Sec. 9.3.1.4 of IEEE std 802.11™-2016 (i.e. address of the nonbandwidth signaling TA from the Address 2 field of the immediately previous individually addressed data frames—e.g., the address of source AP-STA 104 in the present example).) (D) FCS field: specifies an FCS calculated over all of the fields of the MAC header and the Frame Body field (for example, as specified in Sec. 9.2.4.8 of IEEE std 802.11™-2016). (E) CW Bitmap field: provides a bit map indication of the decoding status of each of the codewords $b_1^T$ to $b_{NCW}^T$ decoding status, e.g. "1" means the codeword was successfully decoded; "0" means the codeword was unsuccessfully decoded.

As indicated above, the CW Bitmap field of HARQ frame 600B has a length of 6 octets, thus allowing the decoding status for up to 48 codewords to be indicated. In some examples, an alternative format may be used for HARQ frame 600B in which the CW Bitmap field has a length greater than 6 octets, for example K octets, where KK is greater than or equal to 1, and the value of K is specified or selected based on the number of codewords. In some examples, the destination STA 102 may by configured to use HARQ frame 600B with a 6-octet CW Bitmap field, and in some examples STA 102 will use a HARQ frame 600B with a K-octet CW Bitmap field when NCW≤8*K.

In some example embodiments, the source station AP-STA 104 and destination station STA 102 may be configured to also use HARQ frame 600A or 600B instead of an Ack frame to indicate a completely successful decoding. In such cases, CW Bitmap field of the HARQ frame 600A or 600B will be set to indicate a successful decoding for all received codewords. Accordingly, in example embodiments, a HARQ frame 600A or 600B can function as an Ack frame (e.g. CW Bitmap set to indicate all codewords are successfully decoded) and as a Nack Frame (e.g. at least some bits in CW Bitmap indicate unsuccessfully decoded codewords).

In some cases, a situation may occur in where all codewords are successfully decoded at destination STA 102, however the FCS decoding status does not pass, and in some examples the destination STA 102 is configured to respond to such situations by not sending any feedback message 413. As specified in existing IEEE Std 802.11™-2016, if the source STA does not receive an acknowledgement within a timeout period, it interprets that a failure of PPDU transmission has occurred and may retransmit the PPDU.

An example format used for a HARQ-type frame in feedback message 413 to acknowledge a PPDU 300 that includes an A-MPDU 304 having MPDUs 302 will be described with respect to FIG. 9, which shows the frame format of a BlockAck_CW frame 900 that can be modulated on RF signal 411. Sec. 10.3.2.9 of IEEE std 802.11™-2016 specifies a frame format for a BlockAck frame 900 that includes a Block Ack (BA) Bitmap subfield in a BA Information field. The Block Ack Bitmap subfield includes 64 bits which can indicate the status of up to 64 aggregated MPDUs, based on the FCS fields of those MPDUs. In example embodiments, BlockAck_CW frame 900 has a similar format to that specified in Sec. 10.3.2.9 of IEEE std 802.11™-2016 for a BlockAck frame, however the BA Information field is extended to include CW Bitmap subfields for each of the MPDUs, as described below.

Figure 9:
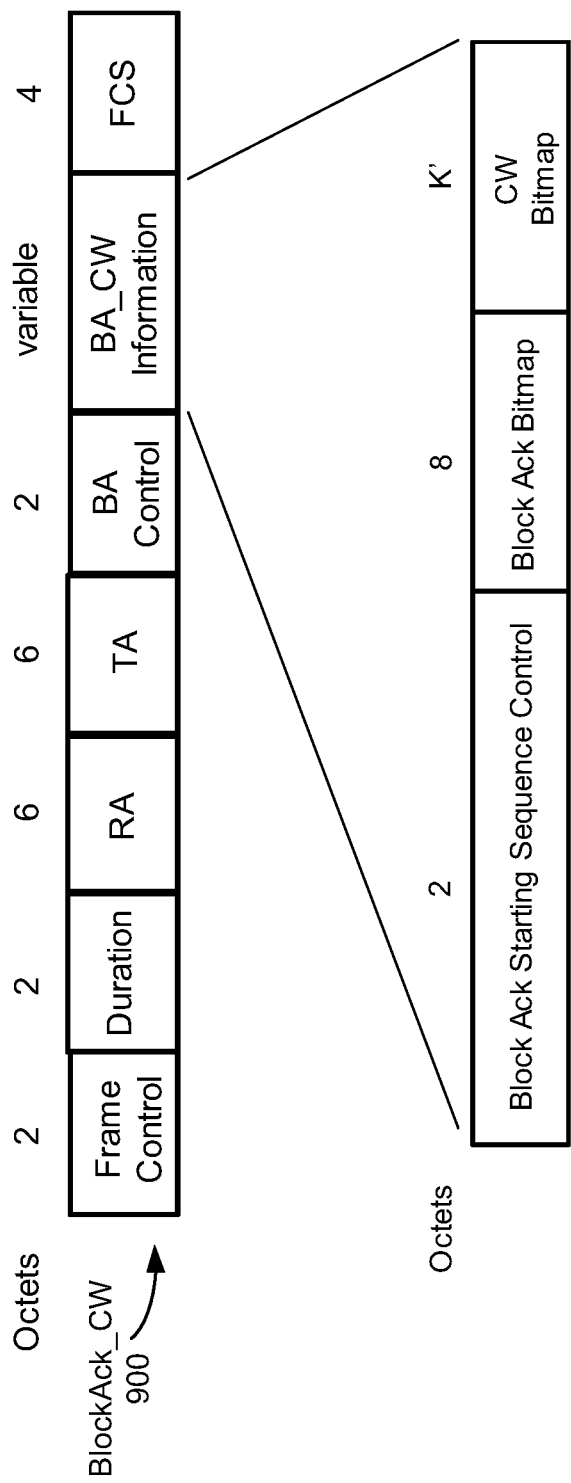
FIG. 9 illustrates an example of a BlockAck frame format for use in the communication network of FIG. 1.

As shown in FIG. 9, the frame format for BlockAck_CW frame 900 includes the following fields: 2 octet "Frame control" field; 2 octet "Duration" field; 6 octet "receive address (RA)" field; 6 octet "transmit address (TA)" field; 2 octet "BA control" field; K' octet "BA_CW Information" field (K≥1) and a 4 octet FCS field. In BlockAck_CW frame 900, the respective fields are used as follows: (A) Frame control field: includes Type and Subtype subfields that indicate frame type. (B) Duration field: specifies a duration value for the estimated time for an Ack frame or Block-Ack_CW frame plus a SIFS. (C) RA field: address of the station that the BlockAck_CW frame 900 is being sent to. (D) TA field: address of the station transmitting the Block-Ack_CW frame 900. (E) BA control field: identifies the BlockAck CW frame variant, which in turn species the format used for the BA-CW information. (F) FCS field: specifies an FCS calculated over all of the previous fields (including the BA-CW information field). (G) BA_CW Information Field: includes a 2 octet Block Ack Starting Sequence control sub-field and 8 octet Block Ack Bitmap sub-field, as well as a CW Bitmap subfield for the codewords of all MPDUs. The Block Ack Starting Sequence control sub-field and Block Ack Bitmap sub-field perform the same function as the specified in Sec. 10.3.2.9 of IEEE std 802.11™-2016 for a BlockAck frame. The CW Bitmap subfield includes a CW bitmap that specifies a decoding status for each codeword included in the MPDUs embedded in the received PPDU 300.

Referring again to FIG. 4, and in particular to source actions 400 performed at source AP-STA 104, after transmitting the PPDU 300 the source AP-STA 104 is configured to wait for a feedback message 413 from the destination STA 102 that indicates a decoding status for each of the codewords $b_1$ to $b_{NCW}$ included in the PPDU 300. The feedback message 413 may, in various examples, take the form of an Ack frame, HARQ frame 600A, or HARQ frame 600B (with 6 octet or K-octet CW Bitmap field length) in the case of a PPDU 300 that included a single MPDU 302, or a BlockAck_CW frame 900 in the case of a PPDU 300 that included multiple aggregated MPDUs 302. As indicated by Action 412, the source AP-STA 104 is configured to wait a defined time-out period for the feedback message 413. In example embodiments, if the feedback message 413 is not received within the time-out period, the source AP-STA 104 determines that the transmission of PPDU 300 was a complete failure and returns to Action 404 to retransmit the entire PPDU 300 over again.

In example embodiments, if the feedback message 413 is received before the expiration of the time-out period is an Ack frame (or a HARQ frame indicating a completely successful decoding) no data retransmission is required. Otherwise, the source AP-STA 104 is configured to identify, based on CW bitmap(s) included in the feedback message 413 which codewords were unsuccessfully decoded at the destination STA 102 and then retransmit the unsuccessfully decoded codewords (or versions of the incorrectly codewords) in a new PPDU 300R (Action 414). Retransmission procedures carried out as part of Action 414 will now be described in greater detail according to some example embodiments.

In at least some example embodiments, the retransmission procedures performed by the source AP-STA 104 to retransmit unsuccessfully decoded codewords and the subsequent decoding procedures performed at destination STA 102 are configured to increase the chance of success based on information known from the failed transmission. By way of background, the extent to which LDPC encoding enables transmission errors to be corrected is impacted by the distribution of combinatorial configurations embedded in the parity-check matrix, such as short cycles, stopping sets for binary erasure channel (BEC) and trapping sets for binary symmetric channel (BSC) and additive white Guassian noise (AWGN) channel. Error events at the high SNR region can be related to smaller stopping sets and trapping sets. Stopping sets and trapping sets are determined by the design of a parity-check matrix and its corresponding Tanner graph for an LDPC code. Forward error rate (FER) in an LDPC based system can be improved by: (1) reducing trapping sets in LDPC code design, (2) avoiding decoder inputs (error patterns) that could fall into trapping sets, and (3) improving the reliability of inputs provided to the decoder. Given that LDPC code designs are already well defined in the art, including for example in IEEE std 802.11™-2016, example embodiments described below are directed to improving FER in retransmitted LPDC codewords by addressing the last two points noted above, namely: (2) avoiding decoder inputs that could fall into trapping sets, and (3) improving the reliability of inputs provided to the decoder.

In this regard, for each failed codeword $b_j$, the source AP-STA 104 knows the bit order and content of the failed codeword $b_j$ and its corresponding source word $s_j$ (which as indicated above corresponds to an information block $IB_j$ information bits segmented from an input data stream). In order to mitigate against patterns in the codeword bits that could fall into trapping sets, in example embodiments the source AP-STA 104 is configured to apply an interleaving procedure to re-order the information bits included in the original information block $IB_j$ to generate a revised source word $s'_j$ which is then LDPC encoded to generate a revised codeword $b'_j$. The revised codeword $b'_j$ can then be transmitted, which in at least some cases may improve the reliability of inputs provided to the decoder 190 of the destination STA 102.

Figure 10:
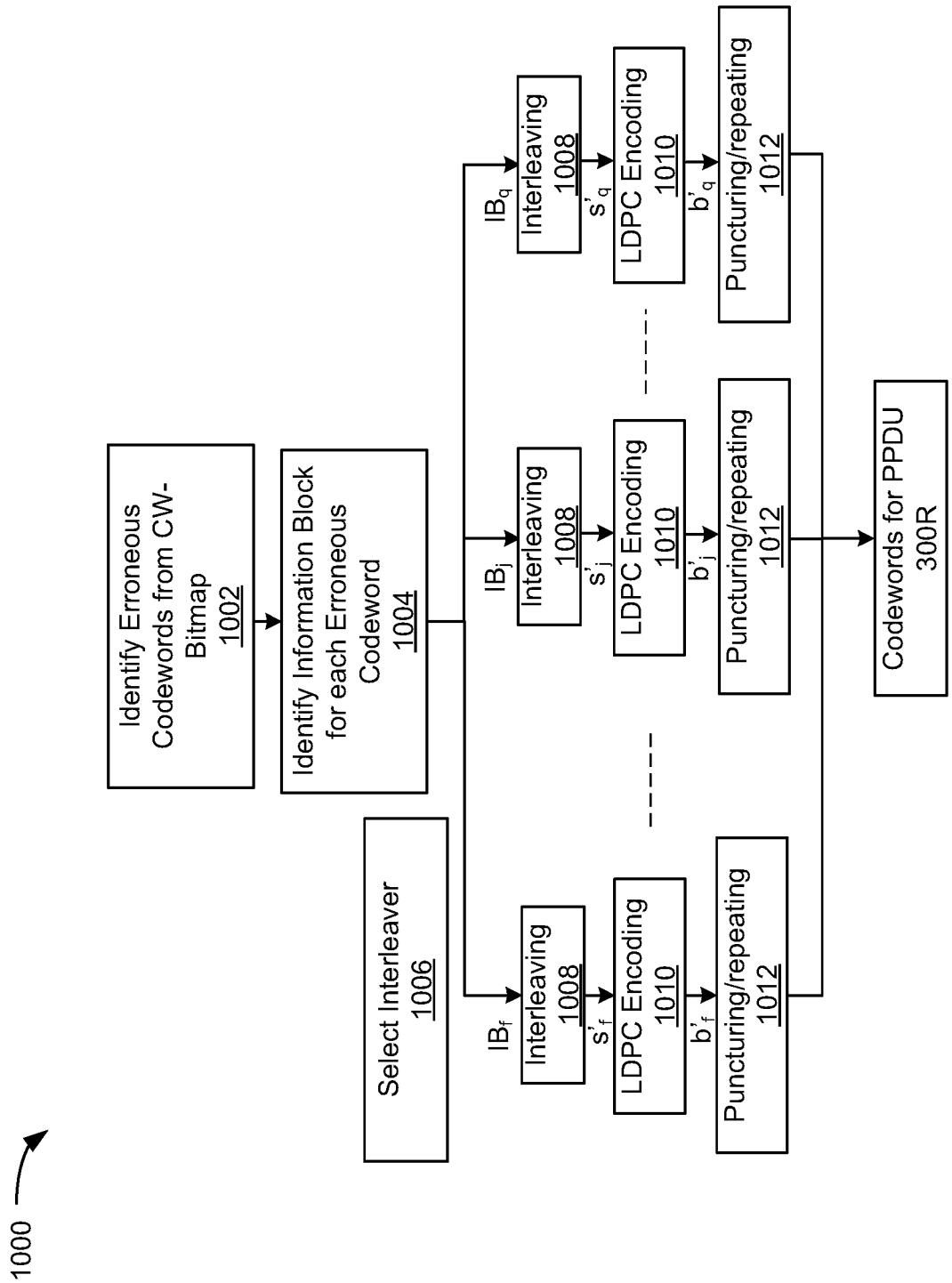
FIG. 10 is a block diagram of a retransmission encoding procedure at a source station, according to example embodiments.

In this regard, FIG. 10 illustrates a MPDU retransmission encoding procedure 1000 that is performed as part of Action 414 at source AP-STA 104 in example embodiments. As indicated by Action 1002, the unsuccessfully decoded codewords from an MPDU 302 included in originally transmitted PPDU 300 are identified by source AP-STA 104 based on the CW-Bitmap included in feedback message 413. For illustrative purposes, a subset of the original codewords $b_1$ to $b_{NCW}$, for example codewords $b_f$, $b_j$ and $b_q$ are identified as unsuccessfully decoded for the present explanation. The original information blocks (eg. $IB_f$, $IB_j$ and $IB_q$) used for the original source words $s_f$, $s_j$ and $s_q$ that correspond to the unsuccessfully decoded codewords $b_f$, $b_j$ and $b_q$ are selected (Action 1004) for respective re-encoding procedures. The re-encoding procedure will be described with reference to representative information Block $IB_j$. In particular, in example embodiments, interleaving 1008 (discussed in detail below) is applied to re-order the information bits included in the original information block $IB_j$ to generate a revised source word $s'_j$ which is then subjected to LDPC encoding 1010 to generate a revised codeword $b'_j$. In example embodiments, LDPC encoding 1010 applied in procedure 1000 uses the same LPDC codes as were used in LDPC encoding 504 of the original encoding procedure 500.

In example embodiments, the revised codeword $b'_j$ is then subjected to puncturing/repeating 1012. In some example embodiments, the puncturing/repeating 1012 applied in procedure 1000 is the same as that performed in the puncturing/repeating 506 applied during the original encoding procedure 500. It will be appreciated that using the same puncturing/repeating sequence for the re-transmission as used for the original transmission corresponds to known chase combining (CC) retransmission techniques. In some example embodiments, the puncturing/repeating 1012 applied in procedure 1000 is different than that performed in the puncturing/repeating 506 applied of the original encoding procedure 500. In particular, fewer or different parity check bits may be punctured in puncturing/repeating 1012 than in the puncturing/repeating 506 applied of the original encoding procedure 500. It will be appreciated that using different puncturing for re-transmission of FEC encoded data than that used for the original transmission corresponds to known incremental redundancy (IR) retransmission techniques.

As shown in FIG. 10, the revised codewords $b'_f$, $b'_j$ and $b'_q$ generated from the respective re-encoding procedures are then combined to provide an MPDU for embedding in a retransmission PPDU 300R.

In example embodiments, interleaving 1008 is performed by an interleaver implemented by encoder 162. In at least some embodiments, the interleaving procedure used for the retransmission of LDPC codewords is selected based on the specific LDPC code applied by LDPC encoding. For example, different interleaving properties may be applied for LPDC codes with different rates and codeword lengths. Furthermore, in some example embodiments it is possible that multiple retransmissions may occur, and the specific interleaving procedure that is applied may be selected based on the particular retransmission iteration. In this regard, in some examples the MPDU retransmission encoding procedure 1000 includes a select interleaver action 1006 that selects an interleaving process to use for interleaving 1008 based on one or more of: the LPDC code being applied, and the retransmission iteration.

Figure 11:
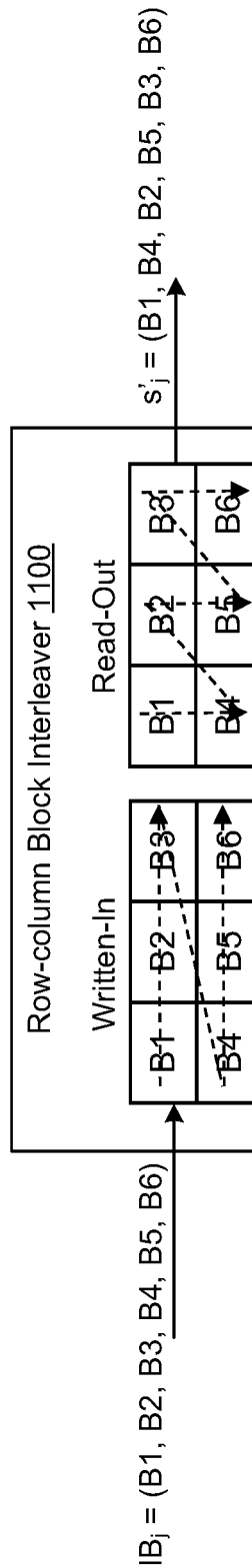
FIG. 11 illustrates an example of a row-column block interleaver.

In one example embodiment, interleaving 1008 can be implemented using a row-column block interleaver in which the information bits from an information block $IB_j$ are input into an M by N matrix in a first order (e.g. row-by-row) and then read out in a different order (e.g. column-by-column) to generate revised source word $s'_j$. In this regard, a simplified example of a row-column block interleaver 1100 is illustrated in FIG. 11, showing information bits B1 to B6 of information block $IB_j$=(B1, B2, B3, B4, B5, B6) being written into an M=2 row by N=3 column matrix on a row-by-row-basis. The information bits are read out column-by-column to generate revised source word $s'_j$=(B1, B4, B2, B5, B3, B6).

In example embodiments, the dimensions of the matrix used for row-column block interleaver 1100 are selected (e.g. during the select interleaver Action 1006) based on the LPDC code that will be applied during LDPC encoding 1010. By way of example, matrix dimensions that result in optimized interleaving performance may be predetermined for each possible LPDC code rate/source word length(k)/codeword length(n), and the optimized matrix dimensions then used for each LPDC code. In one example embodiment, the matrix used for row-column block interleaver 1100 has a constant number of columns (for example N=54), and the number of rows (M) is selected from a set of predetermined values based on the LPDC code. In this regard, FIG. 12 shows a chart that identifies 12 unique LPDC code rate/source word length(k)/codeword length(n) combinations that correspond to different LPDC codes, along with a column 1202 that specifies the number of matrix rows (M) that are to be used in a N=54 column matrix for the row-column block interleaver 1100. Alternative row-column block interleaver configurations can be used that have a total number of matrix entries that is equal to the number source word bits (e.g. N*M=k). In some examples, different row-column block interleaver configurations are used for different retransmission iterations. In some examples, the interleaver selection for a particular retransmission may specify that no interleaving be applied. For example, no interleaving may be selected for a first retransmission, a row-column block interleaver configuration based on the chart of FIG. 12 may be selected for a $2^{nd}$ retransmission, and a further row-column block interleaver configuration selected for a third retransmission.

In a case that a different interlever is used for each retransmission, a retransmission index may be included in the PHY Header of the PPDU 300R which embeds the retransmitted MPDU or A-MPDU.

In some example embodiments, interleaving 1008 can be implemented using circular permutation interleaving. By way of example, FIG. 13 represents a circular permutation interleaver 1300. In the example of FIG. 13, the output $y_a$ (a=0, 1, 2, . . . , k−1) (i.e. revised source word $s'_j$) of the circular permutation interleaver is a function of the information bits $x_b$ (b=0, 1, 2, . . . , k−1) (information block $IB_j$) and the circular permutation interleaver can be described by the following function:

$$b=(a+P(R)\cdot N_{ROT}) \bmod k$$

where: k denotes the length of information bits of the transmitted LDPC code;
P(R) denotes a variable permutation coefficient, which depends on the number of current transmission R;
$N_{ROT}$ denotes a fixed permutation coefficient.

Accordingly, it will be appreciated that, in at least some example embodiments, retransmission encoding procedure 1000 generates revised versions of the codewords identified in a CW_bitmap of feedback message 413 as being unsuccessfully decoded. The revised codewords b' (for example $b'_f$, $b'_j$, $b'_q$ from the example of FIG. 10) are included in a retransmission PPDU 300R. In the case where feedback message 413 is a BlockAck frame 900 including a CW-Bitmap in respect of multiple MPDUs, the retransmission encoding procedure 1000 is carried out corresponding to CW-Bitmap, and PPDU 300R may include an A-MPDU 304 for retransmission. Any of the original codewords $b_1$ to $b_{NCW}$ that were successfully decoded following the first transmission are not represented or included in the retransmission PPDU 300R. In some examples, new data may be added to PPDU 300R such that PPDU 300R includes codewords than correspond to revised versions of previously unsuccessfully decoded codewords as well as completely new codewords.

Referring again to FIG. 4, the source AP-STA 104 is configured to modulate retransmission PPDU 300R onto an RF signal 415 for transmission through a channel of wireless medium 106. Destination STA 102 is configured to receive and demodulate RF signal 415 (Action 416) to recover soft channel bit values for the codewords $b'^T$ included in the retransmission PPDU 300R, which are then subjected to a retransmission decoding procedure 418. The actions taken during retransmission decoding procedure 418 in respect of a retransmitted codeword $b'^T_j$ are illustrated in FIG. 14 in accordance with one example embodiment.

As noted above, in example embodiments the destination STA 102 can provide a codeword decoding log that includes decoding results for unsuccessfully decoded codewords $b^T$ from the original PPDU transmission. The codeword decoding log (indicated by reference number 1402 in FIG. 14) may for example identify, for each unsuccessfully decoded codeword $b_j^T$: the soft channel bit values output by demodulator 180 and the LLR values output by LLR calculator 192. In example embodiments, the values included in codeword decoding log 1402 are available for combining with corresponding values generated in respect of retransmitted codewords to assist in decoding of the retransmitted codewords. In at least some example embodiments where multiple retransmissions occur, the codeword decoding log 1402 can provide retransmission values as well as the original transmission values associated with codewords.

Figure 14:
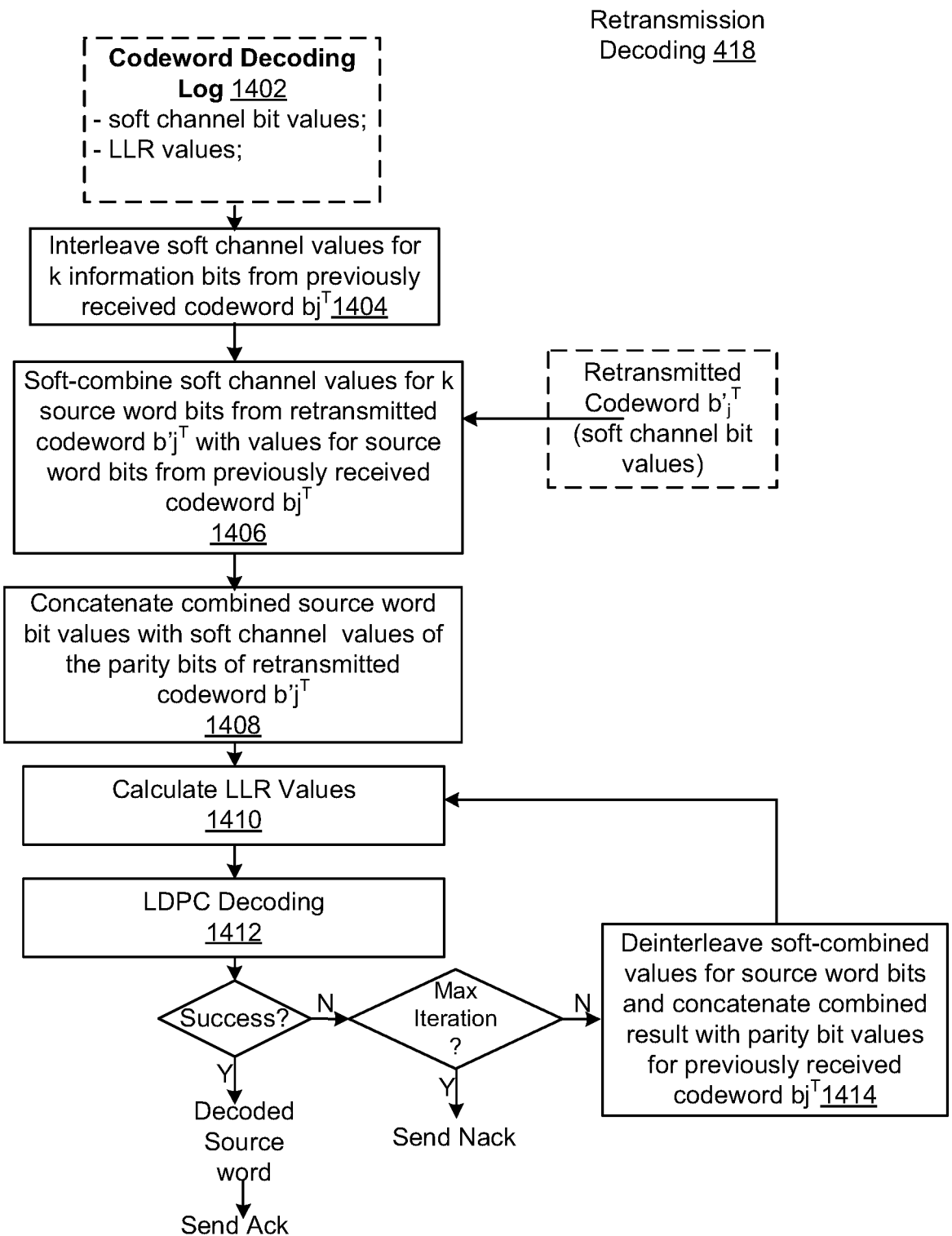
FIG. 14 illustrates a retransmission decoding procedure according to an example embodiment.

Accordingly, in the example retransmission decoding procedure 418 shown in FIG. 14, retransmission decoding 418 begins with interleaving the soft channel bit values previously determined for the k information bits from the original codeword $b_j^T$ (Action 1404). The interleaving applied in Action 1404 is the same as that applied to the information block IBj by the source AP-STA 102 to generate revised source word $s'_j$. Thus, Action 1404 aligns the information bit order for the soft channel bit values of the original codeword $b_j^T$ with the information bit order of the soft channel bit values retransmitted codeword $b'_j^T$. The aligned soft channel bit values for the information bits (e.g. the source word bits) of the retransmitted codeword $b'_j^T$ and the original codeword $b_j^T$ are then soft-combined (Action 1406). The combined source code bit values are then concatenated with the soft channel values of the parity bits of retransmitted codeword $b'_j^T$, resulting in a hybrid codeword $b_j^{H\,T}$ that is made of k information bits that are each soft-combinations of the soft channel values of both the original and retransmitted information bits, together with the soft channel values of the parity bits of retransmitted codeword $b'_j^T$. LLR values are then calculated for the bits of the hybrid codeword $b_j^{H\,T}$ (Action 1410) and LDPC decoding is performed based on the LLR values (Action 1412).

As indicated in FIG. 14, in example embodiments if LDPC decoding is not successful and a maximum number of iterations has not been reached, then a different combination of soft channel bit values from the original and retransmitted codewords can be tried. In the particular example of FIG. 14, the soft-combined channel values for the source word bits generated in Action 1406 are de-interleaved to bring the order of the source word bits back into alignment with the bit order of original source word $s_j$, and the soft-combined channel values for the originally received transmitted and currently received source word bits are then concatenated with the soft channel values of the parity bits of original codeword $b_j^T$(Action 1414). The new hybrid codeword is made of k-information bits that are each soft-combinations of the soft channel values of both the original and retransmitted information bits, together with the soft channel values of the parity bits of original codeword LLR values are then calculated for the new hybrid codeword (Action 1410) and LPDC decoding (Action 1412) is carried out again. In example embodiments, different permutations and combinations can be carried out in Action 1414 in different iterations to create different revised hybrid codewords until successful decoding occurs or a maximum number of iterations is reached.

If successful decoding occurs, an Ack message indicating success can be sent to source AP-STA 104. Such an Ack message could be in the Ack frame format defined in IEEE std 802.11™-2016, or as noted above, alternatively could be feedback message 413 in which the CW-bitmap(s) indicates a successful decoding for each codeword.

As indicated in FIG. 4, if successful decoding does not occur, a feedback message 413 including CW-bitmap indicating the unsuccessfully decoded codeword(s) can be generated and sent to source AP-STA 104 (Action 420). In this regard, as indicated by Action 422, source AP-STA 104 is configured to wait for the feedback message 413 for a timeout period. Retransmission action 414 can be repeated if unsuccessfully decoded codewords remain, and as noted above different interleaving properties or procedures may be applied in respect of further retransmissions.

Referring again to the retransmission decoding procedure 418 shown in FIG. 14, the combining and concatenating actions can similarly be performed between successive sets of retransmitted codewords.

Figure 15:
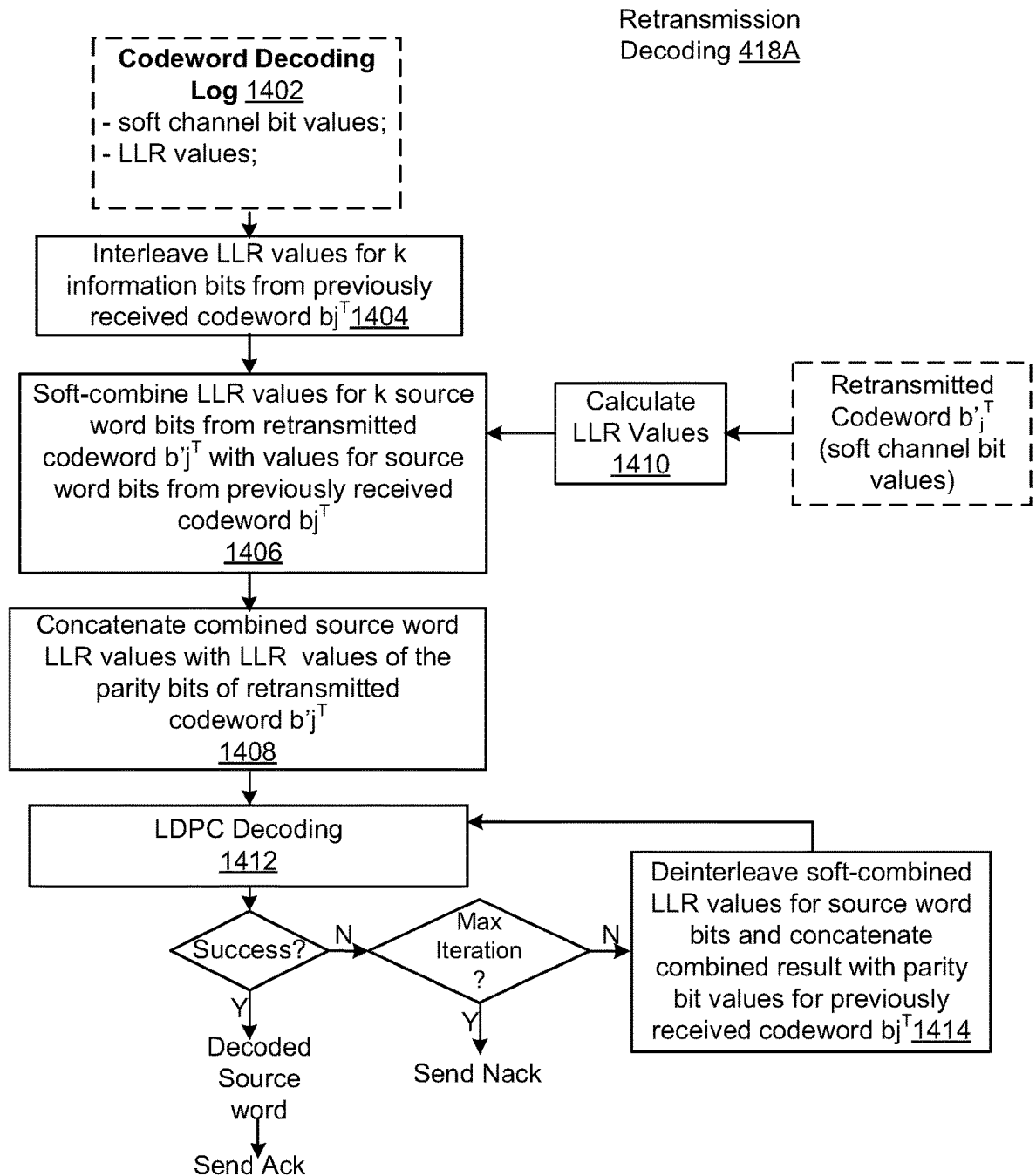
FIG. 15 illustrates a retransmission decoding procedure according to another example embodiment.

As noted above, the retransmission decoding procedure 418 shown in FIG. 14 is one example of a number of different possibilities in which information from two different transmissions of the same information bits can be combined to mitigate against error patterns when decoding and improve the quality of inputs to the decoder. In this regard, FIG. 15 shows an alternative retransmission decoding procedure 418A. Alternative retransmission decoding procedure 418A differs from retransmission decoding procedure 418 in that the values that are combined in Action 1406 are based on calculated LLR values rather than the soft channel bit values.

Figure 16:
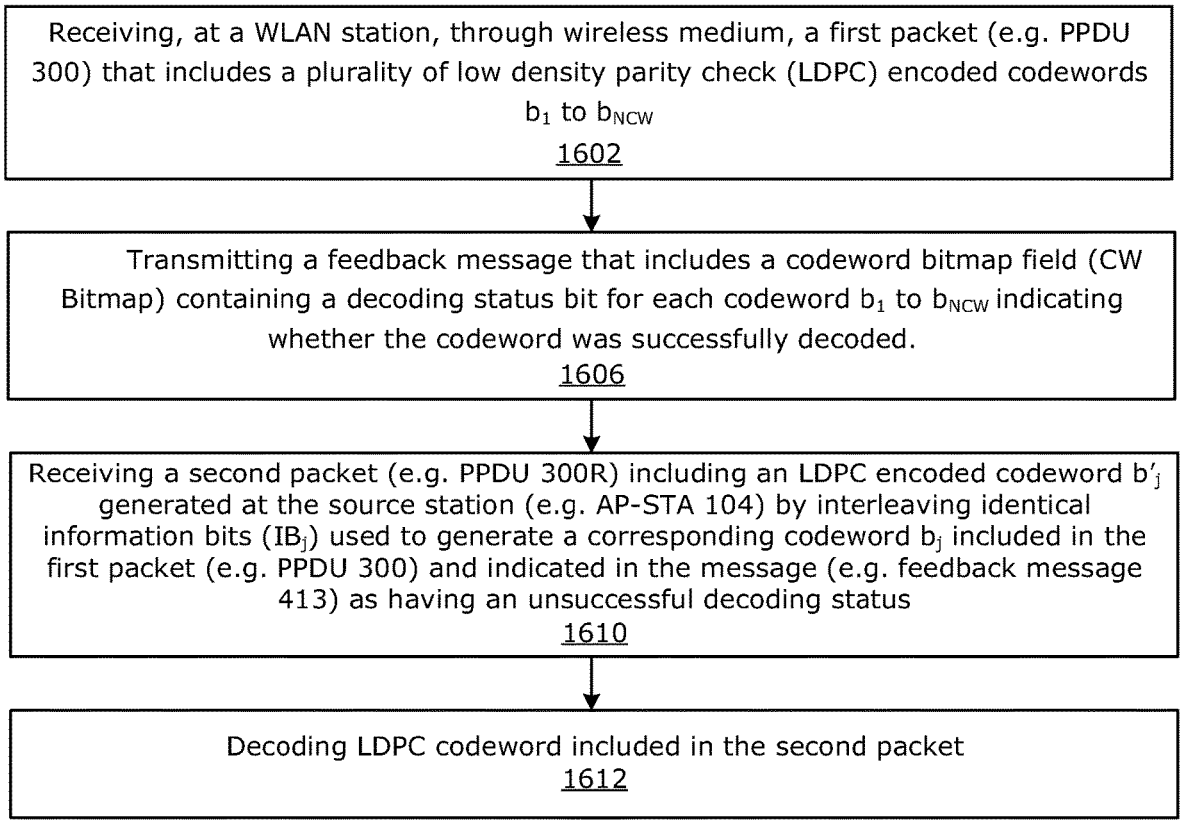
FIG. 16 is a flow diagram illustrating a method performed at a destination station according to example embodiments.

Example embodiments of a method performed at a destination WLAN station (for example STA 102) are summarized with reference to FIG. 16. The method includes: receiving at the station, through wireless medium 106, a first packet (e.g. PPDU 300) that includes a plurality of low density parity check (LDPC) encoded codewords $b_1$ to $b_{NCW}$ (block 1602); and transmitting a feedback message (e.g. feedback message 413) that includes a codeword bitmap field (CW Bitmap) containing a decoding status bit for each codeword $b_1$ to $b_{NCW}$ indicating whether the codeword was successfully decoded. (block 1606)

In some examples the feedback message 413 takes the form of a negative acknowledgment (Nack) frame (for example HARQ frame 600A) that includes, in the following order: a frame control field, a duration field, a codeword bitmap field for the codeword bitmap, and a frame check sequence (FCS) field. In some examples, the feedback message takes the form of a HARQ frame (for example HARQ Fame 600B) that includes, in the following order: a frame control field, a duration field, a receiver address field, a codeword bitmap field and an FCS field.

In some examples, the first packet (e.g. PPDU 300) includes multiple data units that each include a respective plurality of LDPC encoded codewords and the codeword bitmap including a decoding status bit for each of the codewords included in the data units. In such examples, the response message 413 may take the form of a block acknowledgement (BA) frame that includes, in the following order: a frame control field, a duration field, a receiver address field, a transmitter address field, a BA control field, BA bitmap field that indicates a respective status bit for each of the data units, a codeword bitmap field for the codeword bitmap, and a frame check sequence (FCS) field.

In some example embodiments, the method further includes receiving at the destination station, through the wireless medium 106, a second packet (e.g. PPDU 300R). The second packet includes an LDPC encoded codeword $b'_j$ generated at the source station (e.g. AP-STA 104) by interleaving identical information bits ($IB_j$) used to generate a corresponding codeword $b_j$ included in the first packet (e.g. PPDU 300) and indicated in the message (e.g. feedback message 413) as having an unsuccessful decoding status (block 1610). The LDPC codeword included in the second packet is then decoded (block 1612).

In example embodiments, decoding the LDPC codeword included in the second packet includes combing information from LDPC codeword included in the second packet with information from the corresponding codeword included in the first packet. In some examples, combining information includes: soft combining log-likelihood ratio (LLR) values or soft channel values obtained in respect of information bits included in the LDPC codeword included in the second packet with respective LLR values or soft channel values obtained in respect of corresponding information bits included in the corresponding codeword included in the first packet. In some examples, combining information includes concatenating the soft combined LLR values or soft channel values for the information bits with values obtained in respect of parity check bits included in the LDPC codeword included in the second packet. In some examples, combining information includes concatenating the soft combined LLR values or soft channel values for the information bits with values obtained in respect of parity check bits included in the LDPC codeword included in the first packet.

Figure 17:
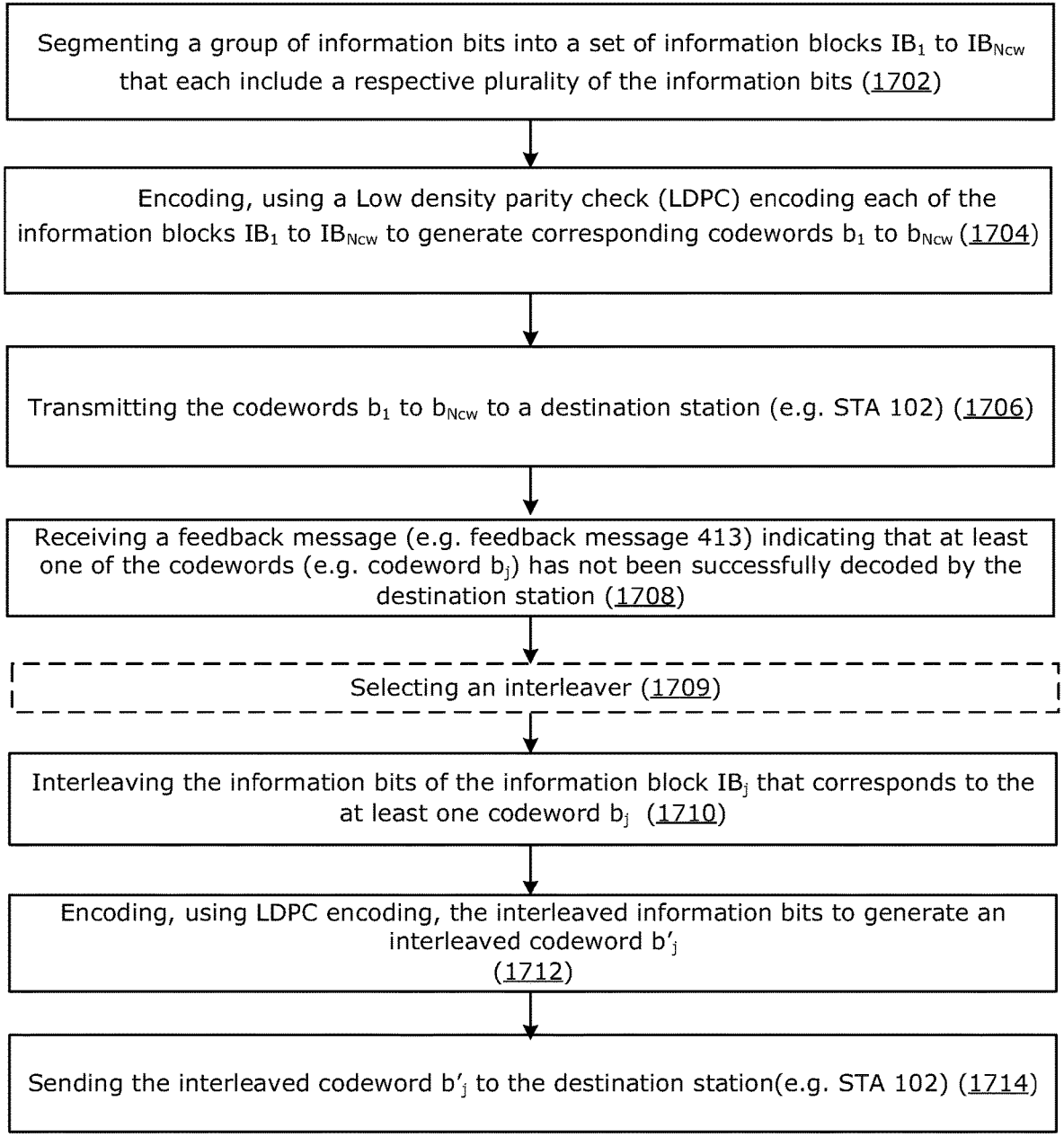
FIG. 17 is a flow diagram illustrating a method performed at a source station according to example embodiments.

Example embodiments of a method performed at a source station (for example AP-STA 104) are summarized with reference to FIG. 17. As indicated in FIG. 17, the method includes segmenting a group of information bits into a set of information blocks $IB_1$ to $IB_{N_{Cw}}$ that each include a respective plurality of the information bits (block 1702); encoding, using low density parity check (LDPC) encoding each of the information blocks $IB_1$ to $IB_{N_{Cw}}$ to generate corresponding codewords $b_1$ to $b_{N_{Cw}}$ (block 1704); transmitting the codewords $b_1$ to $b_{N_{CW}}$ to a destination station (e.g. STA 102) (block 1706); receiving a feedback message (e.g. feedback message 413) indicating that at least one of the codewords (e.g. codeword $b_j$) has not been successfully decoded by the destination station (block 1708); interleaving the information bits of the information block $IB_j$ that corresponds to the at least one codeword $b_j$ (block 1710); encoding, using LDPC encoding, the interleaved information bits to generate an interleaved codeword $b'_j$ (block 1712); and sending the interleaved codeword $b'_j$ to the destination station. (e.g. STA 102) (Block 1714). In some examples, the method also includes selecting an interleaver to use for the interleaving (Block 1709). In some examples the interleaver is selected based on an LDPC code used for the LDPC encoding. In some examples the interleaver is selected based on a number of times the information bits of the information block that corresponds to the at least one codeword have been previously included in codewords sent to the destination station.

In some examples, interleaving the information bits comprises applying row-column block interleaving to the information bits by writing the information bits into an M row by N column matrix in a first order and reading the information bits out of the matrix in a second order, wherein M*N is equal to the number of information bits. In some examples N=54, and the information bits are written into the matrix on a row-by-row basis and read out of the matrix on a column-by-column basis.

In some examples, interleaving the information bits comprises applying circular permutation interleaving.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of transmitting data, comprising:
    segmenting a first group of unencoded information bits into a set of information blocks that each include a respective plurality of the unencoded information bits;
    encoding, using low density parity check (LDPC) encoding, each of the information blocks to generate corresponding codewords;
    transmitting the codewords to a destination station;
    responsive to receiving a feedback message indicating that at least one of the codewords has not been successfully decoded by the destination station, identifying a first information block of the set of information blocks corresponding to a first codeword of the at least one of the codewords that has not been successfully decoded by the destination station;
    responsive to identifying the first information block, interleaving a second group of unencoded information bits representing a subset of the first group of unencoded information bits and associated with the first information block, to generate interleaved unencoded information bits associated with a revised first information block;
    encoding, using low density parity check (LDPC) encoding, the interleaved unencoded information bits associated with the revised first information block to generate a revised first codeword, wherein values obtained in respect of parity check bits included in the first codeword are different from values obtained in respect of parity check bits included in the revised first codeword; and
    transmitting the revised first codeword to the destination station.

2. The method of claim 1 comprising selecting an interleaver to use for the interleaving based on an LDPC code used for the LDPC encoding.

3. The method of claim 1 comprising selecting an interleaver to use for the interleaving based on a number of times the information bits of the information block that corresponds to the at least one codeword have been previously included in codewords sent to the destination station.

4. The method of claim 1 wherein the feedback message includes a codeword bitmap field containing a decoding status bit for each codeword indicating whether the codeword was successfully decoded.

5. A station enabled for use in a wireless area local area network (WLAN), the station comprising:
- a processing unit; and
- a memory storing instructions executable by the processing unit to cause the station to:
  - segment a first group of unencoded information bits into a set of information blocks that each include a respective plurality of the unencoded information bits;
  - encode, using low density parity check (LDPC) encoding, each of the information blocks to generate corresponding codewords;
  - transmit the codewords to a destination station;
  - responsive to receiving a feedback message indicating that at least one of the codewords has not been successfully decoded by the destination station, identify a first information block of the set of information blocks corresponding to a first codeword of the at least one of the codewords that has not been successfully decoded by the destination station;
  - responsive to identifying the first information block, interleave a second group of unencoded information bits representing a subset of the first group of unencoded information bits and associated with the first information block, to generate interleaved unencoded information bits associated with a revised first information block;
  - encode, using low density parity check (LDPC) encoding, the interleaved unencoded information bits associated with the revised first information block to generate a revised first codeword, wherein values obtained in respect of parity check bits included in the first codeword are different from values obtained in respect of parity check bits included in the revised first codeword; and
  - transmit the revised first codeword to the destination station.

6. The station of claim 5, wherein the instructions cause the station to select an interleaver to use for the interleaving based on an LDPC code used for the LDPC encoding.

7. The station of claim 5 wherein the instructions cause the station to select an interleaver to use for the interleaving based on a number of times the information bits of the information block that corresponds to the at least one codeword have been previously included in codewords sent to the destination station.

8. The station of claim 5 wherein the feedback message includes a codeword bitmap field containing a decoding status bit for each codeword indicating whether the codeword was successfully decoded.

9. A method for decoding codewords at a station of a wireless local area network (WLAN), comprising:
- receiving at the station, through a wireless medium, a first packet that includes a plurality of low density parity check (LDPC) encoded codewords, each of the plurality of LDPC encoded codewords being generated by encoding a respective set of unencoded information bits;
- transmitting a feedback message that includes a codeword bitmap field containing a decoding status bit for each interleaved codeword indicating whether the codeword was successfully decoded; and
- after transmitting the feedback message, receiving at the station, through the wireless medium, a second packet including a revised LDPC encoded codeword generated at a source station by interleaving the unencoded information bits used to generate a corresponding codeword included in the first packet and indicated in the message as having an unsuccessful decoding status, and encoding, using LDPC encoding, the interleaved unencoded information bits, wherein values obtained in respect of parity check bits included in the codeword are different from values obtained in respect of parity check bits included in the revised LDPC encoded codeword.

10. The method of claim 9 wherein the feedback message comprises a frame that includes, in the following order: a frame control field, a duration field, the codeword bitmap field, and a frame check sequence (FCS) field.

11. The method of claim 10 wherein the frame control field and the duration field each have a size of 2 octets, the codeword bitmap field has a size of 6 octets, and the FCS field has a size of 4 octets.

12. The method of claim 9 wherein the feedback message comprises a frame that includes, in the following order: a frame control field, a duration field, a receiver address field, the codeword bitmap field and a frame check sequence (FCS) field.

13. The method of claim 12 wherein the frame control field and the duration field each have a size of 2 octets, the receiver address field has a size of 6 octets or less, the codeword bitmap field has a size of 1 octet or greater based on the number of codewords transmitted in PPDU, and the FCS field has a size of 4 octets.

14. The method of claim 9 wherein the first packet includes multiple data units that each include a respective plurality of LDPC encoded codewords, the codeword bitmap including a decoding status bit for each of the codewords included in the data units.

15. The method of claim 14 wherein the feedback message comprises a block acknowledgement (BA) frame that includes, in the following order: a frame control field, a duration field, a receiver address field, a transmitter address field, a BA control field, BA bitmap field that indicates a respective status bit for each of the data units, a codeword bitmap field for the codeword bitmap, and a frame check sequence (FCS) field.

16. The method of claim 9 comprising, after receiving the second packet, decoding the revised LDPC codeword included in the second packet.

17. The method of claim 16 wherein decoding the LDPC codeword included in the second packet includes combining information from LDPC codeword included in the second packet with information from the corresponding codeword included in the first packet.

18. The method of claim 17 wherein combining information includes: soft combining log-likelihood ratio (LLR) values obtained in respect of information bits included in the LDPC codeword included in the second packet with LLR values obtained in respect of corresponding information bits included the corresponding codeword included in the first packet.

19. The method of claim 18 wherein combining information includes concatenating the soft combined LLR values for the information bits with values obtained in respect of parity check bits included in the LDPC codeword included in the second packet and concatenating the soft combined LLR values for the information bits with values obtained in respect of parity check bits included in the LDPC codeword included in the first packet.

20. The method of claim 18 wherein combining information includes: soft combining channel bit values obtained in respect of information bits included in the LDPC codeword included in the second packet with channel bit values obtained in respect of corresponding information bits included the corresponding codeword included in the first packet.

* * * * *